(12) United States Patent
Lu et al.

(10) Patent No.: US 12,144,113 B2
(45) Date of Patent: Nov. 12, 2024

(54) CIRCUIT BOARD STRUCTURE

(71) Applicant: Unimicron Technology Corp., Taoyuan (TW)

(72) Inventors: Chih-Chiang Lu, New Taipei (TW); Chi-Min Chang, Taoyuan (TW); Ming-Hao Wu, Taoyuan (TW); Yi-Pin Lin, Taoyuan (TW); Tung-Chang Lin, Taoyuan (TW); Jun-Rui Huang, Tainan (TW)

(73) Assignee: Unimicron Technology Corp., Taoyuan (TW)

( * ) Notice: Subject to any disclaimer, the term of this patent is extended or adjusted under 35 U.S.C. 154(b) by 244 days.

(21) Appl. No.: 17/938,977

(22) Filed: Sep. 7, 2022

(65) Prior Publication Data

US 2023/0262890 A1    Aug. 17, 2023

Related U.S. Application Data

(60) Provisional application No. 63/359,213, filed on Jul. 8, 2022, provisional application No. 63/344,634, filed
(Continued)

(30) Foreign Application Priority Data

Aug. 5, 2022    (TW) .................................. 111129443

(51) Int. Cl.
*H05K 1/11* (2006.01)
*H05K 1/02* (2006.01)

(52) U.S. Cl.
CPC ........... *H05K 1/115* (2013.01); *H05K 1/0222* (2013.01); *H05K 2201/0195* (2013.01); *H05K 2201/09536* (2013.01); *H05K 2201/09809* (2013.01)

(58) Field of Classification Search
None
See application file for complete search history.

(56) References Cited

U.S. PATENT DOCUMENTS 6,724,638 B1 * 4/2004 Inagaki .................. H05K 1/186
                                                 257/E23.079
9,578,755 B2    2/2017 Mizutani et al.
(Continued)

FOREIGN PATENT DOCUMENTS

TW        I248330    1/2006
TW        I259744    8/2006
(Continued)

OTHER PUBLICATIONS

"Office Action of Taiwan Related Application, Application No. 111149871", issued on Sep. 19, 2023, p. 1-p. 14.

*Primary Examiner* — Hoa C Nguyen
*Assistant Examiner* — John B Freal
(74) *Attorney, Agent, or Firm* — JCIPRNET

(57) ABSTRACT

A circuit board structure includes a substrate, a first build-up structure layer, first and second external circuit layers, at least one first conductive via, and second conductive vias. The first build-up structure layer is disposed on a first circuit layer of the substrate. The first external circuit layer is disposed on the first build-up structure layer. The second external circuit layer is disposed on a second circuit layer and a portion of a third dielectric layer of the substrate. The first conductive via is electrically connected to the first external circuit layer and the second external circuit layer to define a signal path. The second conductive vias surround the first conductive via, and the first external circuit layer, the second conductive vias, the first circuit layer, the outer conductive layer, and the second external circuit layer define a first ground path. The first ground path surrounds the signal path.

22 Claims, 42 Drawing Sheets

Related U.S. Application Data on May 23, 2022, provisional application No. 63/310,103, filed on Feb. 15, 2022.

(56) References Cited

U.S. PATENT DOCUMENTS

| | | |
|---|---|---|
| 9,635,761 B2 | 4/2017 | Brigham et al. |
| 10,249,943 B2 | 4/2019 | Brigham |
| 10,375,838 B2 | 8/2019 | Brigham et al. |
| 2010/0163296 A1 | 7/2010 | Ko et al. |
| 2011/0209905 A1* | 9/2011 | Morita ................ H05K 1/0222 174/257 |

FOREIGN PATENT DOCUMENTS

| | | |
|---|---|---|
| TW | 200843579 | 11/2008 |
| TW | 200843604 | 11/2008 |
| TW | I393490 | 4/2013 |

* cited by examiner

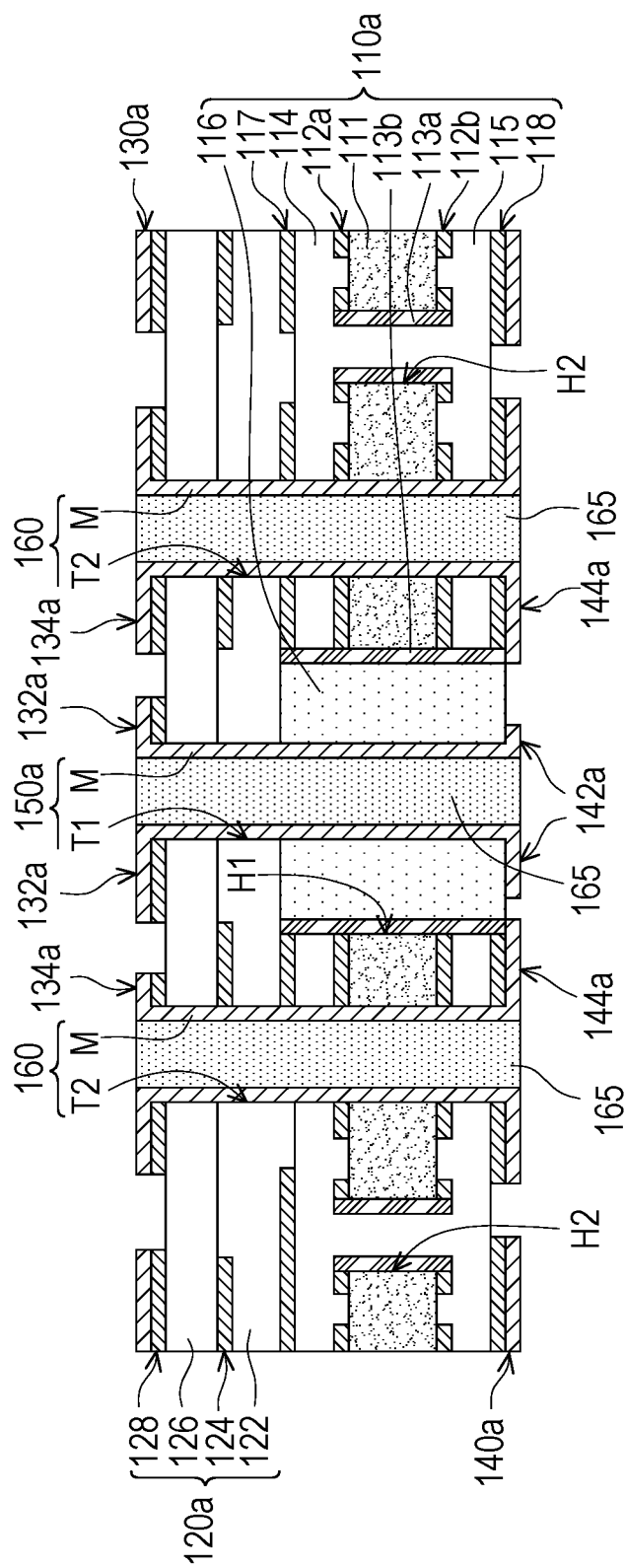
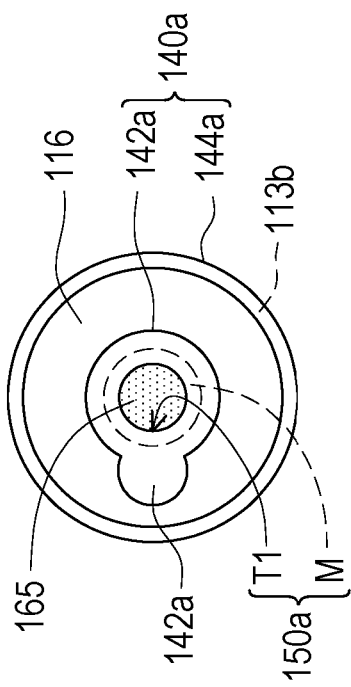
FIG. 5A
FIG. 5B

CIRCUIT BOARD STRUCTURE

CROSS-REFERENCE TO RELATED APPLICATION

This application claims the priority benefit of U.S. provisional application Ser. No. 63/310,103, filed on Feb. 15, 2022, U.S. provisional application Ser. No. 63/344,634, filed on May 23, 2022, and U.S. provisional application Ser. No. 63/359,213, filed on Jul. 8, 2022. This application also claims the priority benefit of Taiwan application serial no. 111129443, filed on Aug. 5, 2022. The entirety of each of the above-mentioned patent applications is hereby incorporated by reference herein.

BACKGROUND OF THE INVENTION

Field of the Invention

The invention relates to a substrate structure, and in particular to a circuit board structure.

Description of Related Art

In the existing circuit board, the design of the coaxial via requires one or more insulating layers between the inner conductive layer and the outer conductive layer for blocking, wherein the method of forming the insulating layers is achieved by pressing a build-up layer. Therefore, there is impedance mismatch at two ends of the coaxial via and there is an electromagnetic interference (EMI) shielding gap, thus affecting the integrity of the high-frequency signal. In addition, in the design of the coaxial via, the two ends of the signal path and the two ends of the ground path are located on different planes, and noise interference may not be reduced.

SUMMARY OF THE INVENTION

The invention provides a circuit board structure that may effectively reduce noise interference and have better signal integrity.

A circuit board structure of the invention includes a substrate, a first build-up structure layer, a first external circuit layer, a second external circuit layer, at least one first conductive via, and a plurality of second conductive vias. The substrate has at least one first opening and includes a core layer, a first inner circuit layer, a second inner circuit layer, an inner conductive layer, a first dielectric layer, a second dielectric layer, a third dielectric layer, a first circuit layer, a second circuit layer, and an outer conductive layer. The first inner circuit layer and the second inner circuit layer are disposed on two opposite sides of the core layer. The core layer has a plurality of second openings, and the inner conductive layer covers an inner wall of the second openings and is connected to the first inner circuit layer and the second inner circuit layer. The first dielectric layer covers the first inner circuit layer and is located between the first inner circuit layer and the first circuit layer. The second dielectric layer covers the second inner circuit layer and is located between the second inner circuit layer and the second circuit layer. The first opening is located between the second openings and penetrates the first circuit layer, the first dielectric layer, the first inner circuit layer, the core layer, the second inner circuit layer, and the second dielectric layer. The outer conductive layer covers an inner wall of the first opening and is connected to the first circuit layer, the first inner circuit layer, the second inner circuit layer, and the second circuit layer. The third dielectric layer completely fills the first opening. The first build-up structure layer is disposed on the first circuit layer. The first external circuit layer is disposed on the first build-up structure layer. The second external circuit layer is disposed on the second circuit layer and a portion of the third dielectric layer. The first conductive via penetrates the first build-up structure layer and the third dielectric layer, and is electrically connected to the first external circuit layer and the second external circuit layer to define a signal path. The second conductive vias surround the first conductive via and penetrate the first build-up structure layer, the first circuit layer, the first dielectric layer, the first inner circuit layer, the core layer, the second inner circuit layer, the second dielectric layer, and the second circuit layer, and are electrically connected to the first external circuit layer, the first circuit layer, the first inner circuit layer, the second inner circuit layer, and the second circuit layer. The first external circuit layer, the second conductive vias, the first circuit layer, the outer conductive layer, and the second external circuit layer define a first ground path, and the first ground path surrounds the signal path.

In an embodiment of the invention, the first build-up structure layer includes a fourth dielectric layer, a third circuit layer, a fifth dielectric layer, and a fourth circuit layer. The fourth dielectric layer is disposed on the first circuit layer and the third dielectric layer. The third circuit layer is disposed on the fourth dielectric layer, and the fifth dielectric layer is disposed on the third circuit layer and the fourth dielectric layer. The fourth circuit layer is disposed on the fifth dielectric layer, and the first external circuit layer is disposed on the fourth circuit layer.

In an embodiment of the invention, the circuit board structure further includes a second build-up structure layer disposed on the second circuit layer and a portion of the third dielectric layer, and the second external circuit layer is located on the second build-up structure layer.

In an embodiment of the invention, the first build-up structure layer further includes at least one first conductive blind hole penetrating the fifth dielectric layer and the fourth circuit layer and electrically connected to the first external circuit layer, the fourth circuit layer, and the third circuit layer. The second build-up structure layer further includes at least one second conductive blind hole penetrating the second build-up structure layer and electrically connected to the second external circuit layer and the second circuit layer.

In an embodiment of the invention, the first build-up structure layer further includes at least one first conductive blind hole penetrating the fifth dielectric layer and the fourth dielectric layer and electrically connected to the first external circuit layer and the first circuit layer. The second build-up structure layer further includes at least one second conductive blind hole penetrating the second build-up structure layer and electrically connected to the second external circuit layer and the second circuit layer.

In an embodiment of the invention, the substrate further has at least one third opening penetrating the first circuit layer, the first dielectric layer, the first inner circuit layer, the core layer, the second inner circuit layer, the second dielectric layer, and the second circuit layer, and communicating with the fourth dielectric layer and the second external circuit layer.

In an embodiment of the invention, the first build-up structure layer further includes at least one first conductive blind hole penetrating the fifth dielectric layer and the fourth circuit layer and electrically connected to the first external circuit layer, the fourth circuit layer, and the third circuit layer.

In an embodiment of the invention, the circuit board structure further includes at least one pad disposed in the fourth dielectric layer of the first build-up structure layer and connected to the first conductive via.

In an embodiment of the invention, a gap is formed between the outer conductive layer, the second dielectric layer, and the second circuit layer, and the third dielectric layer further completely fills the gap.

In an embodiment of the invention, the circuit board structure further includes a hole filling material at least completely filling the second conductive vias.

In an embodiment of the invention, the hole filling material further completely fills the first conductive via.

In an embodiment of the invention, the circuit board structure further includes a first cover layer and a second cover layer. The first cover layer covers the first external circuit layer. The second cover layer covers the second external circuit layer, wherein the first cover layer and the second cover layer cover two ends of the hole filling material respectively.

In an embodiment of the invention, the circuit board structure further includes a first cover layer and a second cover layer. The first cover layer covers the first external circuit layer. The second cover layer covers the second external circuit layer, wherein the first cover layer and the second cover layer respectively cover two ends of the hole filling material completely filling the first conductive via, and expose the two ends of the hole filling material located in the second conductive vias.

In an embodiment of the invention, the first conductive via includes two first conductive vias.

In an embodiment of the invention, the circuit board structure further includes a hole filling material at least completely filling the second conductive vias.

In an embodiment of the invention, the circuit board structure further includes a first cover layer and a second cover layer. The first cover layer covers the first external circuit layer. The second cover layer covers the second external circuit layer, wherein the first cover layer and the second cover layer at least respectively cover two ends of the hole filling material completely filling the first conductive vias.

In an embodiment of the invention, the circuit board structure further includes a third conductive via penetrating the first build-up structure layer, the first circuit layer, the first dielectric layer, the first inner circuit layer, the core layer, the second inner circuit layer, the second dielectric layer, and the second circuit layer, and electrically connected to the first external circuit layer, the first circuit layer, the first inner circuit layer, the second inner circuit layer, and the second circuit layer. The third conductive via is located between the first conductive vias, and the first external circuit layer, the third conductive via, the first circuit layer, the outer conductive layer, and the second external circuit layer define a second ground path, and the signal path is located between the first ground path and the second ground path.

In an embodiment of the invention, the circuit board structure further includes a hole filling material at least completely filling the second conductive vias and the third conductive via.

In an embodiment of the invention, the circuit board structure further includes a first cover layer and a second cover layer. The first cover layer covers the first external circuit layer. The second cover layer covers the second external circuit layer, wherein the first cover layer and the second cover layer at least respectively cover two ends of the hole filling material completely filling the first conductive vias.

In an embodiment of the invention, the first external circuit layer includes a first signal circuit and a first ground circuit. The second external circuit layer includes a second signal circuit and a second ground circuit. The first signal circuit, the first conductive via, and the second signal circuit define a signal path. The first ground circuit, each of the second conductive vias, the first circuit layer, the outer conductive layer, and the second ground circuit define a first ground path.

In an embodiment of the invention, the circuit board structure further includes: a hole filling material at least completely filling the second conductive vias. The first build-up structure layer includes a fourth dielectric layer, a third circuit layer, a fifth dielectric layer, and a fourth circuit layer. The fourth dielectric layer is disposed on the first circuit layer and the third dielectric layer. The third circuit layer is disposed on the fourth dielectric layer, and the fifth dielectric layer is disposed on the third circuit layer and the fourth dielectric layer. The fourth circuit layer is disposed on the fifth dielectric layer, and the first external circuit layer is disposed on the fourth circuit layer. There is a height difference between a first side and a second side of the hole filling material opposite to each other and a first surface of the fifth dielectric layer and a second surface of the second dielectric layer, respectively, and the height difference ranges from more than negative 30 microns to less than 30 microns.

In an embodiment of the invention, the third dielectric layer is recessed between a surface of the first circuit layer and a surface of the second circuit layer, and there is a height difference between the surface of the third dielectric layer and the surface of the second circuit layer, and the height difference ranges from more than negative 30 microns to equal to 0 microns.

Based on the above, in the design of the circuit board structure of the invention, the first conductive via is electrically connected to the first external circuit layer and the second external circuit layer to define a signal path, and the first external circuit layer, the second conductive vias, the first circuit layer, the outer conductive layer, and the second external circuit layer define a ground path, and the ground path surrounds the signal path. Accordingly, a good high-frequency high-speed signal loop may be formed, and in the subsequent application of integrated circuits and antennas, the issue of signal interference on the same plane may also be solved, thus reducing signal energy loss and noise interference, thereby improving signal transmission reliability.

In order to make the aforementioned features and advantages of the disclosure more comprehensible, embodiments accompanied with figures are described in detail below.

BRIEF DESCRIPTION OF THE DRAWINGS

FIG. 5A is a schematic cross-sectional view of a circuit board structure according to another embodiment of the invention.

FIG. 5B is a partial bottom schematic view of the circuit board structure of FIG. 5A.

DESCRIPTION OF THE EMBODIMENTS

Figure 1A:
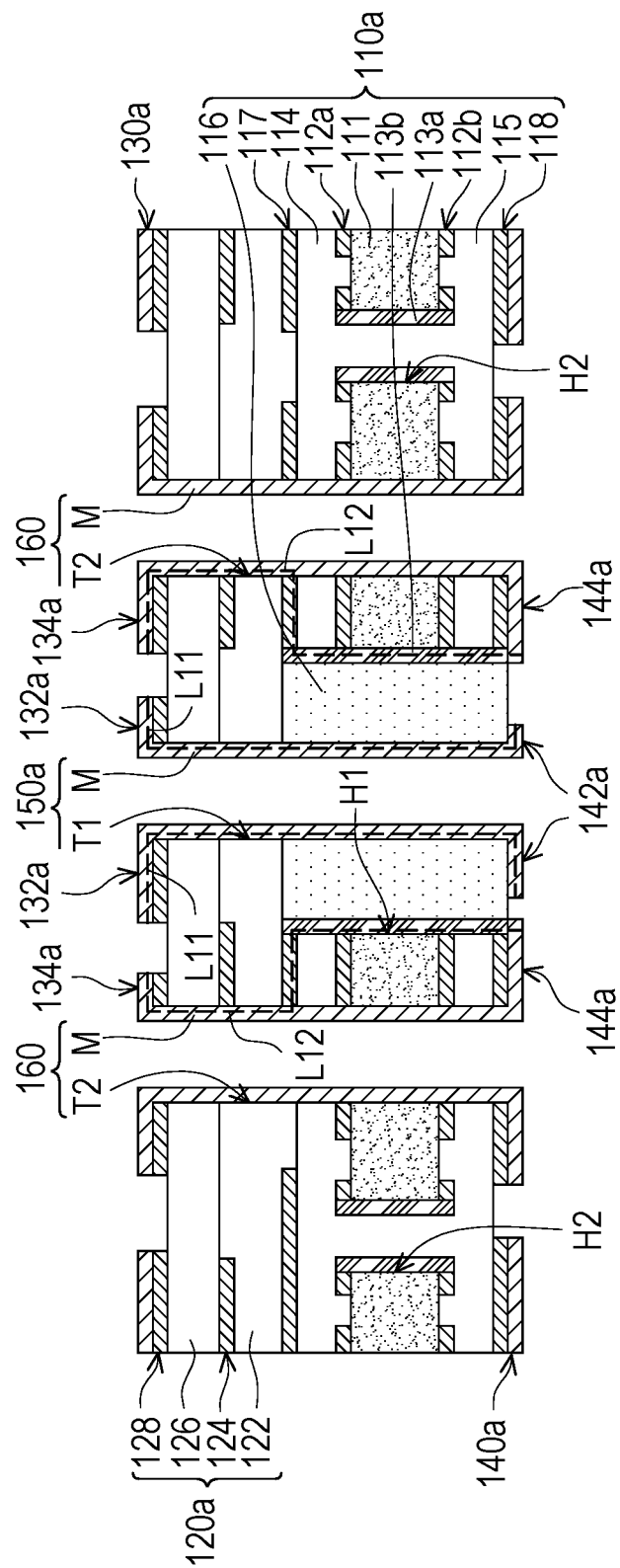
FIG. 1A is a schematic cross-sectional view of a circuit board structure according to an embodiment of the invention.
Figure 1B:
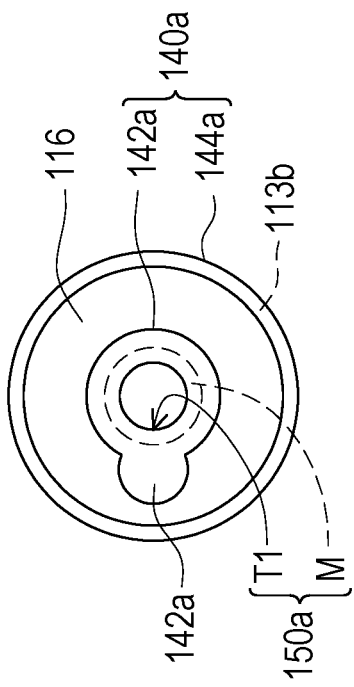
FIG. 1B is a partial bottom schematic view of the circuit board structure of FIG. 1A.

FIG. 1A is a schematic cross-sectional view of a circuit board structure according to an embodiment of the invention. FIG. 1B is a partial bottom schematic view of the circuit board structure of FIG. 1A. Referring to FIG. 1A and FIG. 1B at the same time, in the present embodiment, a circuit board structure 100*a* includes a substrate 110*a*, a first build-up structure layer 120a, a first external circuit layer 130a, a second external circuit layer 140a, at least one first conductive via 150a, and a plurality of second conductive vias 160. The substrate 110a has at least one first opening H1 and includes a core layer 111, a first inner circuit layer 112a, a second inner circuit layer 112b, an inner conductive layer 113a, an outer conductive layer 113b, a first dielectric layer 114, a second dielectric layer 115, a third dielectric layer 116, a first circuit layer 117, and a second circuit layer 118. The first inner circuit layer 112a and the second inner circuit layer 112b are disposed on two opposite sides of the core layer 111. The core layer 111 has a plurality of second openings H2, and the inner conductive layer 113a covers the inner wall of the second openings H2, and is structurally and electrically connected to the first inner circuit layer 112a and the second inner circuit layer 112b. The first dielectric layer 114 covers the first inner circuit layer 112a and is located between the first inner circuit layer 112a and the first circuit layer 117. The second dielectric layer 115 covers the second inner circuit layer 112b and is located between the second inner circuit layer 112b and the second circuit layer 118. The first dielectric layer 114 and the second dielectric layer 115 completely fill the second openings H2 and are connected to each other. The first opening H1 is located between the second openings H2 and penetrates the first circuit layer 117, the first dielectric layer 114, the first inner circuit layer 112a, the core layer 111, the second inner circuit layer 112b, and the second dielectric layer 115. The outer conductive layer 113b covers the inner wall of the first opening H1 and is structurally and electrically connected to the first circuit layer 117, the first inner circuit layer 112a, the second inner circuit layer 112b, and the second circuit layer 118. The third dielectric layer 116 completely fills the first opening H1 and is aligned with the first circuit layer 117 and the second circuit layer 118, meaning the height difference is 0 and there is no height difference. In an embodiment, the first dielectric layer 114, the second dielectric layer 115, and the third dielectric layer 116 should be made of high-frequency high-speed materials, and the dielectric constant of the third dielectric layer 116 should take into account impedance matching, wherein the dielectric loss of the third dielectric layer 116 is greater than 0 and less than 0.1. The lower the dielectric loss, the higher the signal quality.

Referring to FIG. 1A again, the first build-up structure layer 120a of the present embodiment is disposed on the first circuit layer 117. Here, the first build-up structure layer 120a includes a fourth dielectric layer 122, a third circuit layer 124, a fifth dielectric layer 126, and a fourth circuit layer 128. The fourth dielectric layer 122 is disposed on the first circuit layer 117 and the third dielectric layer 116. The third circuit layer 124 is disposed on the fourth dielectric layer 122, and the fifth dielectric layer 126 is disposed on the third circuit layer 124 and the fourth dielectric layer 122. The fourth circuit layer 128 is disposed on the fifth dielectric layer 126, and the first external circuit layer 130a is disposed on the fourth circuit layer 128 of the first build-up structure layer 120a. The second external circuit layer 140a is disposed on the second circuit layer 118 and a portion of the third dielectric layer 116. The first conductive via 150a penetrates the first build-up structure layer 120a and the third dielectric layer 116, and is electrically connected to the first external circuit layer 130a and the second external circuit layer 140a to define a signal path L11. The first conductive via 150a includes a through hole T1 and a conductive material M, wherein the through hole T1 penetrates the first build-up structure layer 120a and the third dielectric layer 116, and the conductive material M covers the inner wall of the through hole T1 and is electrically connected to the first external circuit layer 130a and the second external circuit layer 140a. The second conductive vias 160 surround the first conductive via 150a and penetrate the first build-up structure layer 120a, the first circuit layer 117, the first dielectric layer 114, the first inner circuit layer 112a, the core layer 111, the second inner circuit layer 112b, the second dielectric layer 115, and the second circuit layer 118, and are electrically connected to the first external circuit layer 130a, the first circuit layer 117, the first inner circuit layer 112, the second inner circuit layer 112b, and the second circuit layer 118. The second conductive vias 160 include a through hole T2 and the conductive material M, wherein the through hole T2 penetrates the first build-up structure layer 120a, the first circuit layer 117, the first dielectric layer 114, the first inner circuit layer 112a, the core layer 111, the second inner circuit layer 112b, the second dielectric layer 115, and the second circuit layer 118, and the conductive material M covers the inner wall of the through hole T2 and the first external circuit layer 130a, the fourth circuit layer 128, the third circuit layer 124, the first circuit layer 117, the first inner circuit layer 112a, the second inner circuit layer 112b, and the second circuit layer 118. The first external circuit layer 130a, the second conductive vias 160, the first circuit layer 117, the outer conductive layer 113b, the second external circuit layer 140a define a ground path L12 (i.e., first ground path), and the ground path L12 surrounds the signal path L11. It should be noted that, according to the magnetic force generated by Ampere's right-hand rule, the ground path L12 preferably passes through the outer conductive layer 113b, as shown in FIG. 1A.

Further, in the present embodiment, the first external circuit layer 130a includes a first signal circuit 132a and a first ground circuit 134a. The second external circuit layer 140a includes a second signal circuit 142a and a second ground circuit 144a. The first signal circuit 132a, the first conductive via 150a, and the second signal circuit 142a define the signal path L11. The first ground circuit 134a, each of the second conductive vias 160, the first circuit layer 117, the outer conductive layer 113b, and the second ground circuit 144a define the ground path L12. Here, the circuit board structure 100a is a ground/signal/ground (GSG) design. Since the signal path L11 is surrounded by the ground path L12 and is enclosed in a closed manner, a good high-frequency high-speed loop may be formed.

In short, in the present embodiment, the signal path L11 defined by the first signal circuit 132a, the first conductive via 150a, and the second signal circuit 142a is surrounded and enclosed by the ground path L12 defined by the first ground circuit 134a, each of the second conductive vias 160, the first circuit layer 117, the outer conductive layer 113b, and the second ground circuit 144a. That is, the ground path L12 with good sealing is disposed around the signal path L11 that may transmit high-frequency high-speed signals such as 5G, so that a good high-frequency high-speed loop may be formed. Therefore, the circuit board structure 100a of the present embodiment may have better signal integrity. Here, the high frequency means that the frequency is greater than 1 GHz; and the high speed means that the data transmission speed is greater than 100 Mbps. Furthermore, it is generally known that high-frequency circuits focus on the speed and quality of transmission signals, and the main factors affecting these two are the electrical properties of the transmission material, that is, the dielectric constant (Dk) and dielectric loss (Df) of the material. By reducing the dielectric constant and dielectric loss of the substrate, signal propagation delay time may be effectively shortened, and signal transmission rate may be increased and signal transmission loss may be reduced. Moreover, the first conductive via 150a, the outer conductive layer 113b of the substrate 110a, and the third dielectric layer 116 define a special through via with high frequency and high speed. On any cross section of the special through via, the high-frequency high-speed signal generates a reflow signal via the first conductive via 150a and the corresponding outer conductive layer 113b thereof, forming a high-frequency high-speed equivalent circuit on the cross section. Compared with the prior art, the inner conductive layer and the outer conductive layer of the coaxial via are blocked by the build-up method of pressing the insulating layer. The manufacturing method of the circuit board structure 100a of the present embodiment may avoid the issue of impedance mismatch that affects the integrity of the high-frequency signal. Moreover, since the present embodiment does not use the build-up method of pressing the insulating layer to increase the number of layers of the circuit board, the stacking design of via holes is not used to conduct the adjacent structural layers. Therefore, in addition to overcoming the energy loss of via holes, the issue of poor thermal stress reliability of hole stacking may also be avoided.

It should be mentioned here that, the following embodiments adopt the reference numerals of the embodiment above and a portion of the content thereof, wherein the same reference numerals are used to represent the same or similar elements and descriptions of the same technical content are omitted. The omitted portions are as described in the embodiments above and are not repeated in the embodiments below.

Figure 2A:
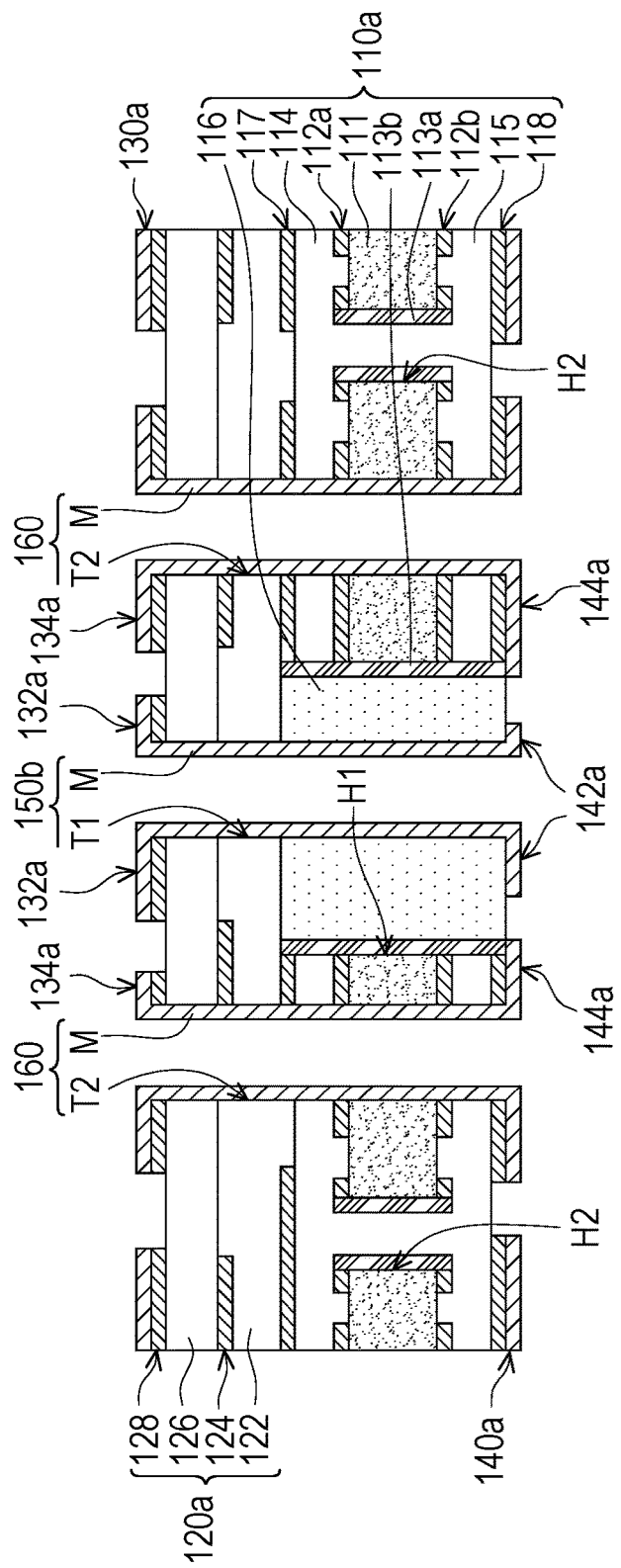
FIG. 2A is a schematic cross-sectional view of a circuit board structure according to another embodiment of the invention.
Figure 2B:
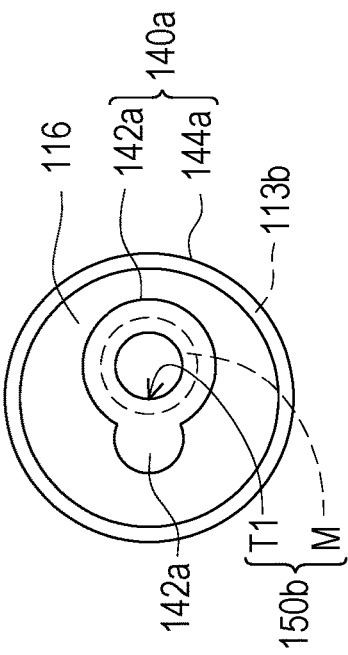
FIG. 2B is a partial bottom schematic view of the circuit board structure of FIG. 2A.

FIG. 2A is a schematic cross-sectional view of a circuit board structure according to another embodiment of the invention. FIG. 2B is a partial bottom schematic view of the circuit board structure of FIG. 2A. Please refer to FIG. 1A, FIG. 1B, FIG. 2A, and FIG. 2B at the same time. A circuit board structure 100b of the present embodiment is similar to the circuit board structure 100a. The difference between the two is that in the present embodiment, in order to achieve the object of impedance matching, a first conductive via 150b may be not disposed in the middle, but rather deviated to one side (e.g., the right side), meaning disposed in a staggered position.

Figure 3A:
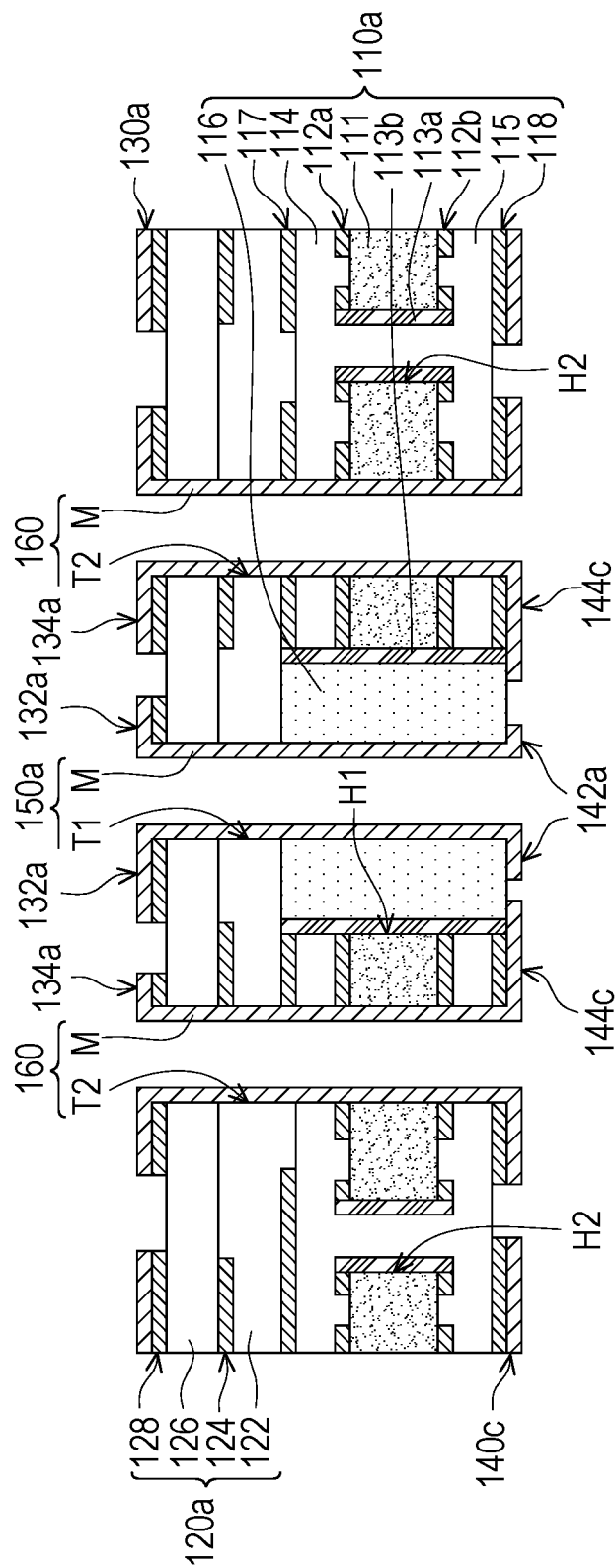
FIG. 3A is a schematic cross-sectional view of a circuit board structure according to another embodiment of the invention.
Figure 3B:
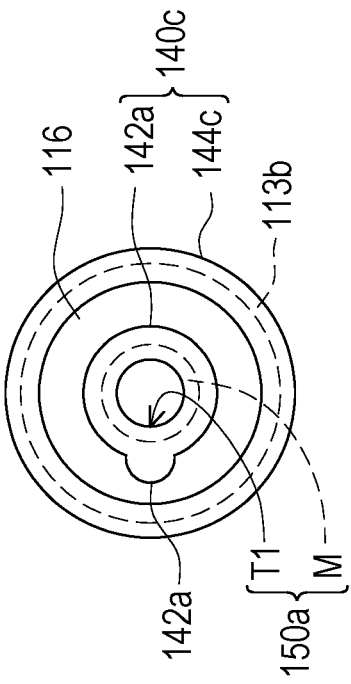
FIG. 3B is a partial bottom schematic view of the circuit board structure of FIG. 3A.

FIG. 3A is a schematic cross-sectional view of a circuit board structure according to another embodiment of the invention. FIG. 3B is a partial bottom schematic view of the circuit board structure of FIG. 3A. Please refer to FIG. 1A, FIG. 1B, FIG. 3A, and FIG. 3B at the same time, a circuit board structure 100c of the present embodiment is similar to the circuit board structure 100a, and the difference between the two is: in the present embodiment, a second external circuit layer 140c connected to the outer conductive layer 113b is further extended to cover the third dielectric layer 116, and is not aligned with the outer conductive layer 113b but is overhanged on the third dielectric layer 116. Therefore, compared with the second ground circuit 144a of FIG. 1A, the contact area of a second ground circuit 144c of the present embodiment is greater, thus improving the subsequent bonding force between electronic elements.

Figure 4A:
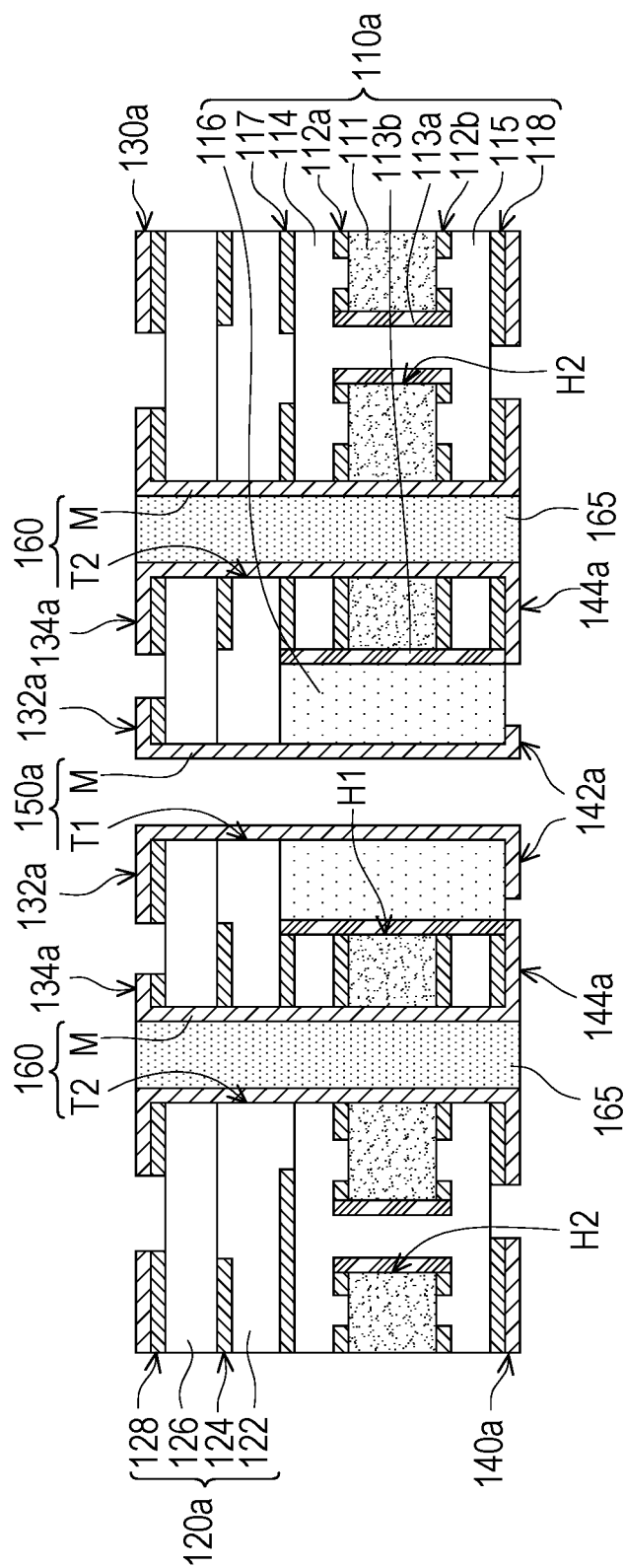
FIG. 4A is a schematic cross-sectional view of a circuit board structure according to another embodiment of the invention.
Figure 4B:
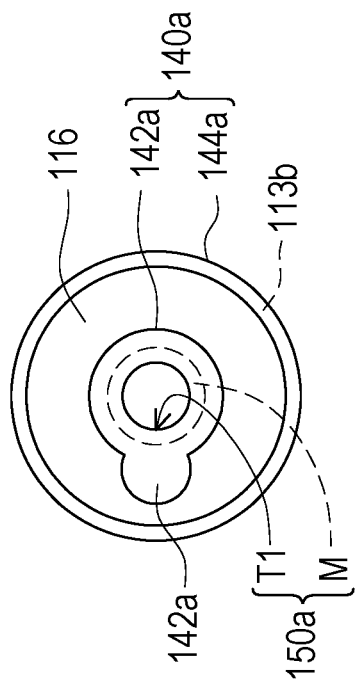
FIG. 4B is a partial bottom schematic view of the circuit board structure of FIG. 4A.

FIG. 4A is a schematic cross-sectional view of a circuit board structure according to another embodiment of the invention. FIG. 4B is a partial bottom schematic view of the circuit board structure of FIG. 4A. Please refer to FIG. 1A, FIG. 1B, FIG. 4A, and FIG. 4B at the same time, a circuit board structure 100d of the present embodiment is similar to the circuit board structure 100a, and the difference between the two is: in the present embodiment, the circuit board structure 100d further includes a hole filling material 165, wherein the hole filling material 165 completely fills the second conductive vias 160, and two opposite sides of the hole filling material 165 may be aligned with the first external circuit layer 130a and the second external circuit layer 140a, respectively. Here, the hole filling material 165 is not filled in the first conductive via 150a. Here, the material of the hole filling material 165 is, for example, resin, which may be regarded as a hole plugging agent, or a dielectric material with a dielectric constant greater than 3.6 and a dielectric loss lower than 0.05.

FIG. 5A is a schematic cross-sectional view of a circuit board structure according to another embodiment of the invention. FIG. 5B is a partial bottom schematic view of the circuit board structure of FIG. 5A. Please refer to FIG. 1A, FIG. 1B, FIG. 5A, and FIG. 5B at the same time, a circuit board structure 100e of the present embodiment is similar to the circuit board structure 100a, and the difference between the two is: in the present embodiment, the circuit board structure 100e further includes the hole filling material 165, wherein the hole filling material 165 completely fills the first conductive via 150a and the second conductive vias 160, and two opposite sides of the hole filling material 165 may be aligned with the first external circuit layer 130a and the second external circuit layer 140a, respectively. Here, the material of the hole filling material 165 is, for example, resin, which may be regarded as a hole plugging agent, or a dielectric material with a dielectric constant greater than 3.6 and a dielectric loss lower than 0.05.

Figure 6A:
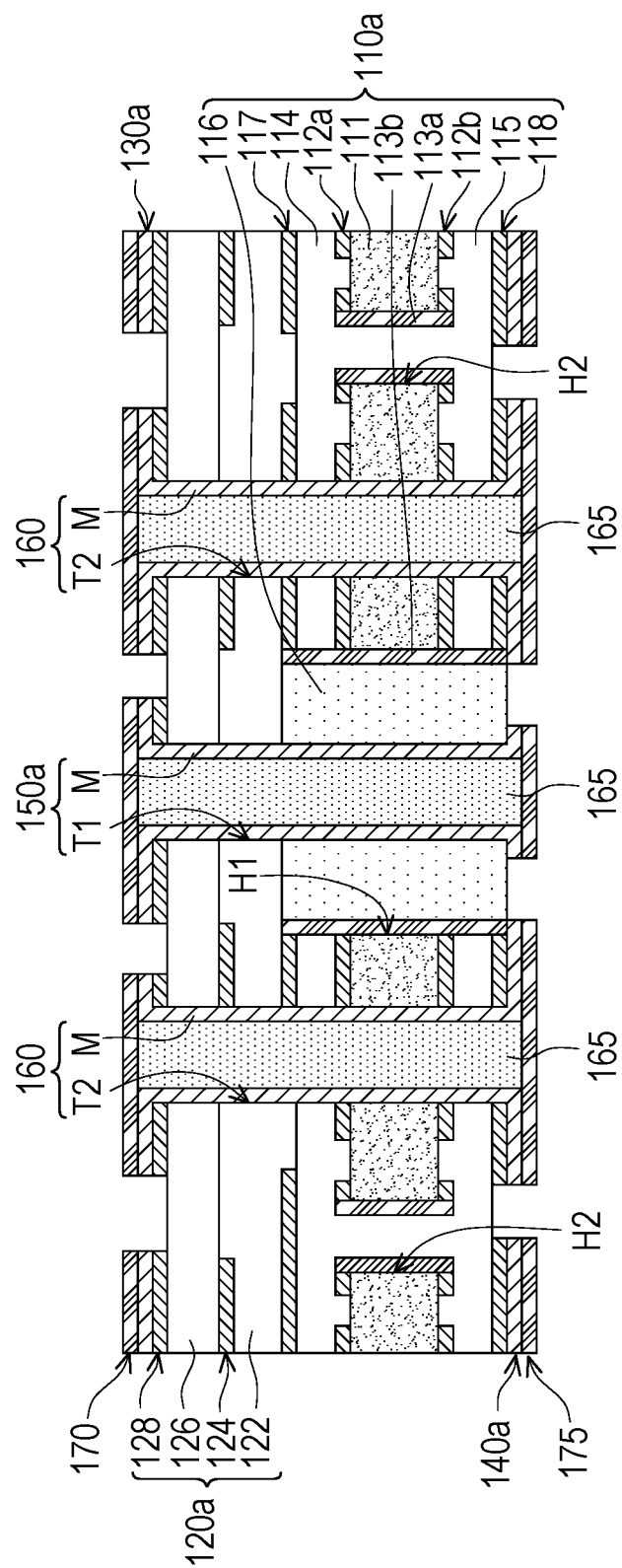
FIG. 6A is a schematic cross-sectional view of a circuit board structure according to another embodiment of the invention.
Figure 6B:
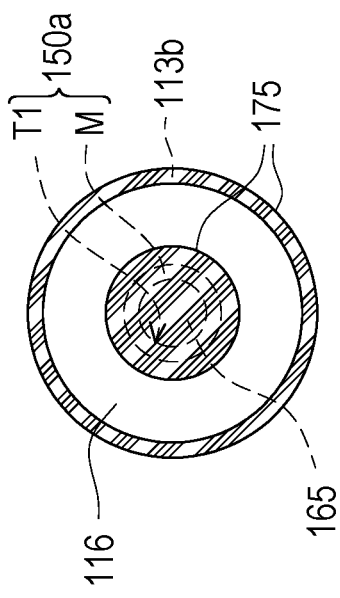
FIG. 6B is a partial bottom schematic view of the circuit board structure of FIG. 6A.

FIG. 6A is a schematic cross-sectional view of a circuit board structure according to another embodiment of the invention. FIG. 6B is a partial bottom schematic view of the circuit board structure of FIG. 6A. Referring to FIG. 5A, FIG. 5B, FIG. 6A, and FIG. 6B at the same time, a circuit board structure 100f of the present embodiment is similar to the circuit board structure 100e, and the difference between the two is: in the present embodiment, the circuit board structure 100f further includes a first cover layer 170 and a second cover layer 175. The first cover layer 170 covers the first external circuit layer 130a. The second cover layer 175 covers the second external circuit layer 140a, wherein the first cover layer 170 and the second cover layer 175 cover two opposite ends of the hole filling material 165 respectively. Here, the material of the first cover layer 170 and the material of the second cover layer 175 may be, for example, copper, but not limited thereto.

Figure 7A:
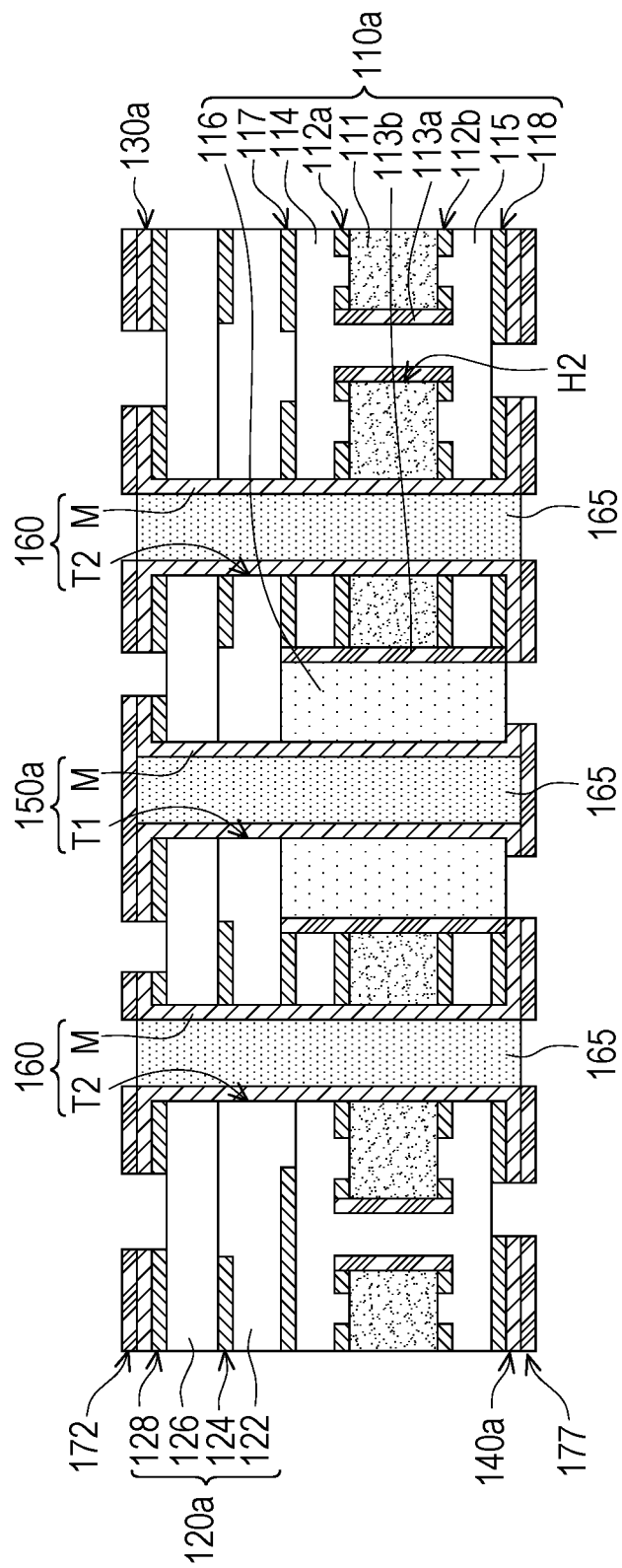
FIG. 7A is a schematic cross-sectional view of a circuit board structure according to another embodiment of the invention.
Figure 7B:
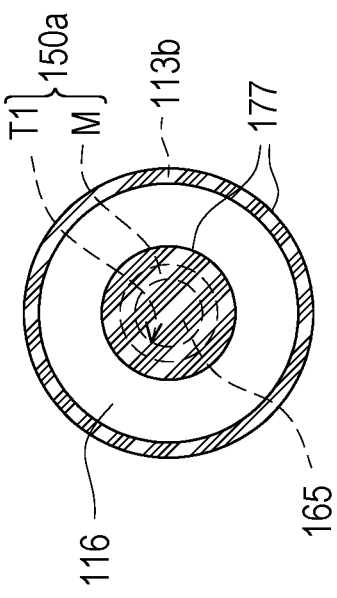
FIG. 7B is a partial bottom schematic view of the circuit board structure of FIG. 7A.

FIG. 7A is a schematic cross-sectional view of a circuit board structure according to another embodiment of the invention. FIG. 7B is a partial bottom schematic view of the circuit board structure of FIG. 7A. Referring to FIG. 5A, FIG. 5B, FIG. 7A, and FIG. 7B at the same time, a circuit board structure 100g of the present embodiment is similar to the circuit board structure 100e, and the difference between the two is: in the present embodiment, the circuit board structure 100g further includes a first cover layer 172 and a second cover layer 177. The first cover layer 172 covers the first external circuit layer 130a, and the second cover layer 177 covers the second external circuit layer 140a, wherein the first cover layer 172 and the second cover layer 177 respectively cover two ends of the hole filling material 165 opposite to each other completely filling the first conductive via 150a, and expose two ends of the hole filling material 165 located in the second conductive vias 160. Here, the material of the first cover layer 172 and the material of the second cover layer 177 may be, for example, copper, but not limited thereto.

Figure 8A:
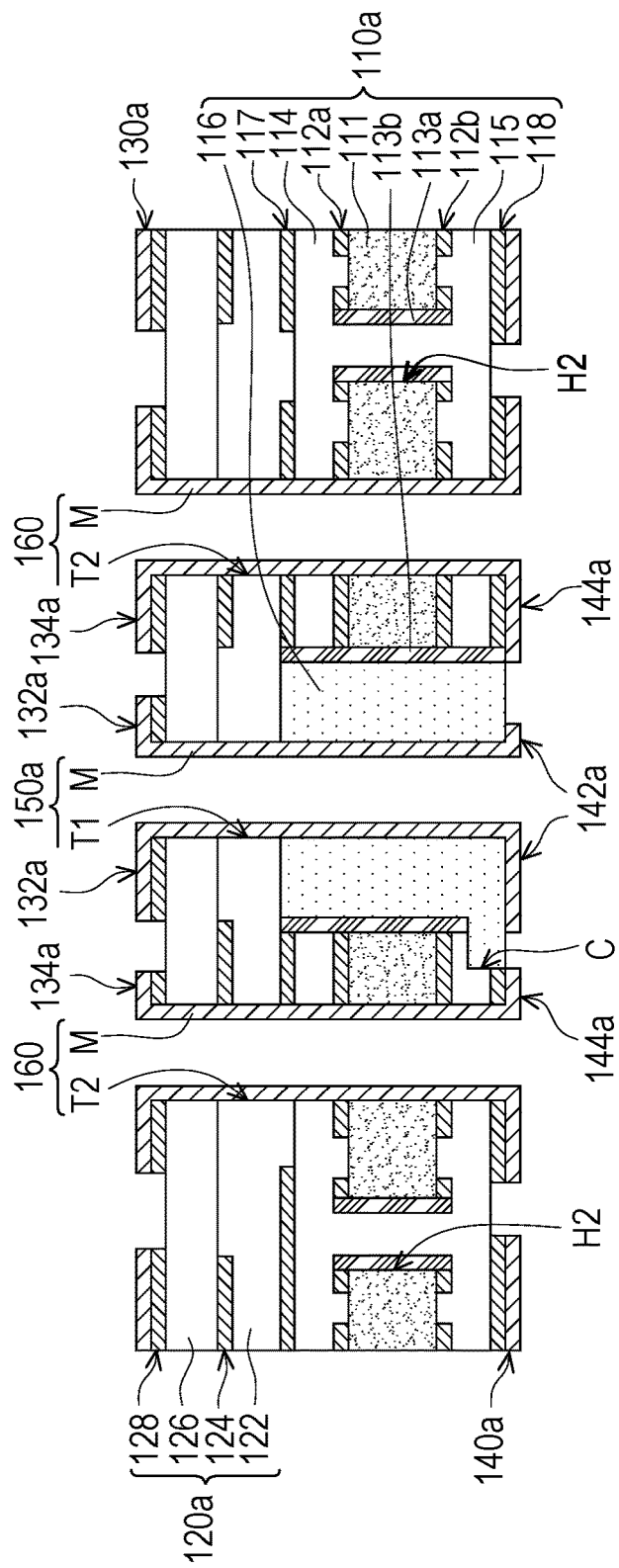
FIG. 8A is a schematic cross-sectional view of a circuit board structure according to another embodiment of the invention.
Figure 8B:
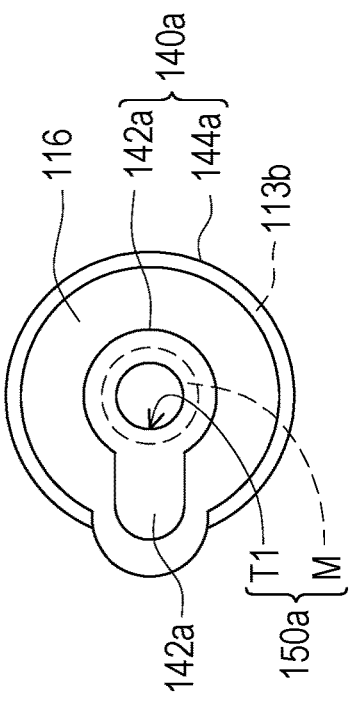
FIG. 8B is a partial bottom schematic view of the circuit board structure of FIG. 8A.

FIG. 8A is a schematic cross-sectional view of a circuit board structure according to another embodiment of the invention. FIG. 8B is a partial bottom schematic view of the circuit board structure of FIG. 8A. Please refer to FIG. 1A, FIG. 1B, FIG. 8A, and FIG. 8B at the same time, a circuit board structure 100h of the present embodiment is similar to the circuit board structure 100a, and the difference between the two is: in the present embodiment, a gap C is formed between the outer conductive layer 113b, the second dielectric layer 115, and the second circuit layer 118, and the third dielectric layer 116 further completely fills the gap C. In the present embodiment, a portion of the outer conductive layer 113b is dug out and removed at the edge of the ground layer hole, and is filled with the third dielectric layer 116, so that the conductive layer circuit in subsequent processing may be fanned out via the gap C. That is, the length of the second signal circuit 142a may increase the contact area when the circuit board structure 100h is subsequently bonded with electronic elements, and communication and short circuit with the second ground circuit 144a do not occur.

Figure 9:
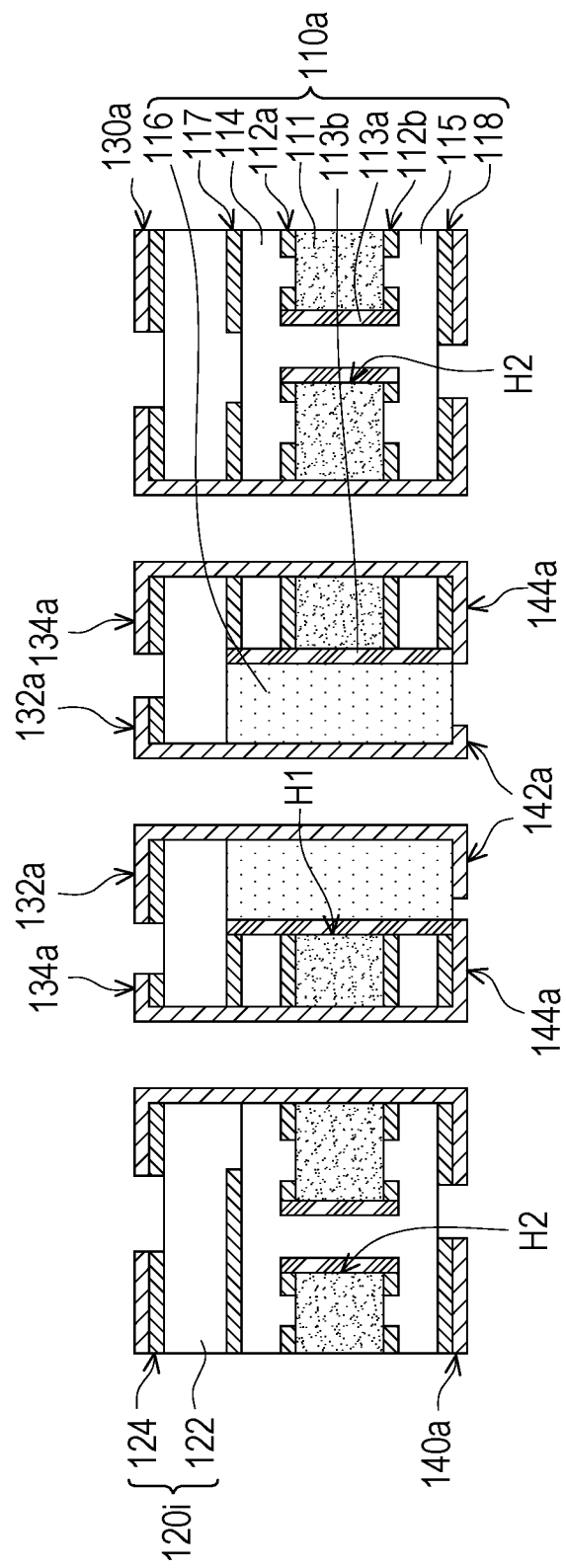
FIG. 9 is a schematic cross-sectional view of a circuit board structure according to another embodiment of the invention.

FIG. 9 is a schematic cross-sectional view of a circuit board structure according to another embodiment of the invention. Please refer to FIG. 1A and FIG. 9 at the same time, a circuit board structure 100i of the present embodiment is similar to the circuit board structure 100a, and the difference between the two is: in the present embodiment, a first build-up structure layer 120i includes the fourth dielectric layer 122 and the third circuit layer 124 disposed on the fourth dielectric layer 122, and the first external circuit layer 130a is directly disposed on the third circuit layer 124.

Figure 10:
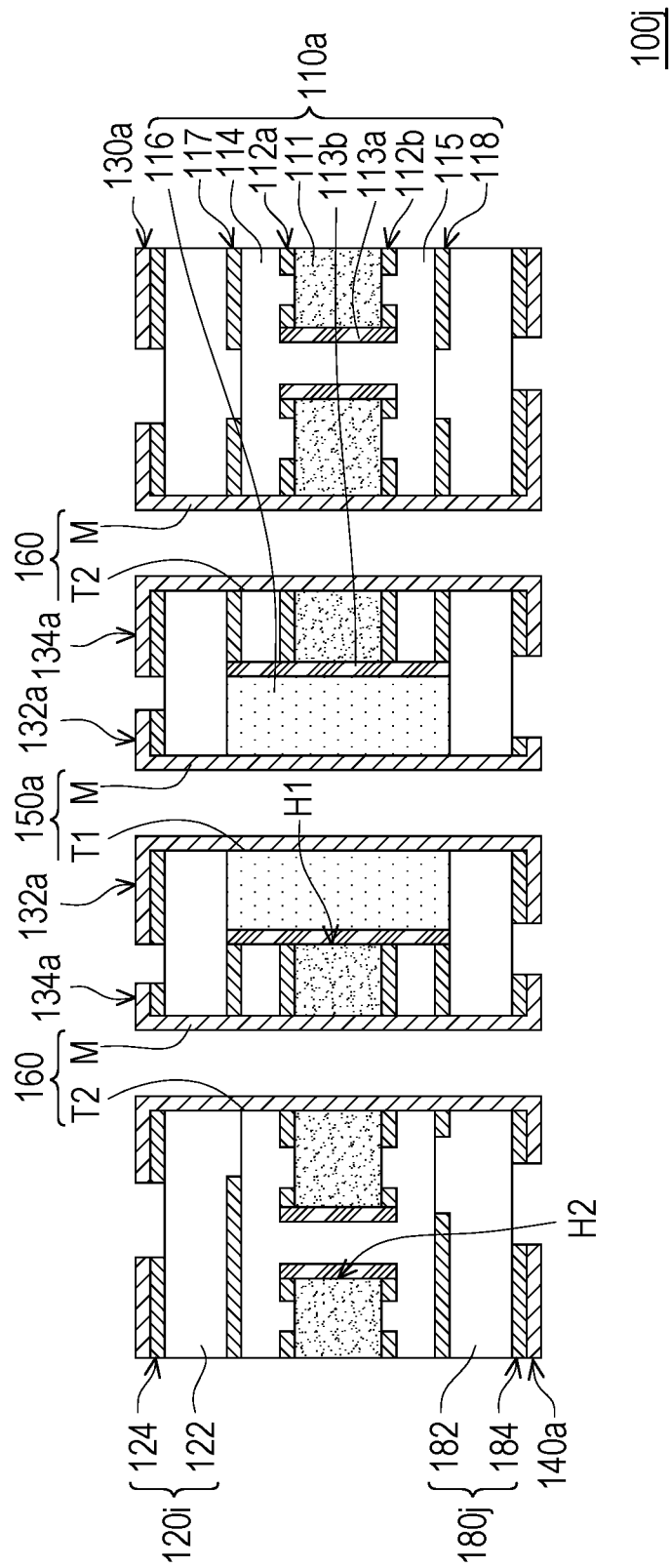
FIG. 10 is a schematic cross-sectional view of a circuit board structure according to another embodiment of the invention.

FIG. 10 is a schematic cross-sectional view of a circuit board structure according to another embodiment of the invention. Please refer to FIG. 9 and FIG. 10 at the same time, a circuit board structure 100j of the present embodiment is similar to the circuit board structure 100i, and the difference between the two is: in the present embodiment, the circuit board structure 100j further includes a second build-up structure layer 180j disposed on the second circuit layer 118 and a portion of the third dielectric layer 116, wherein the second build-up structure layer 180j includes a sixth dielectric layer 182 and a fifth circuit layer 184 disposed on the sixth dielectric layer 182, and the second external circuit layer 140a is located on the fifth circuit layer 184.

Figure 11:
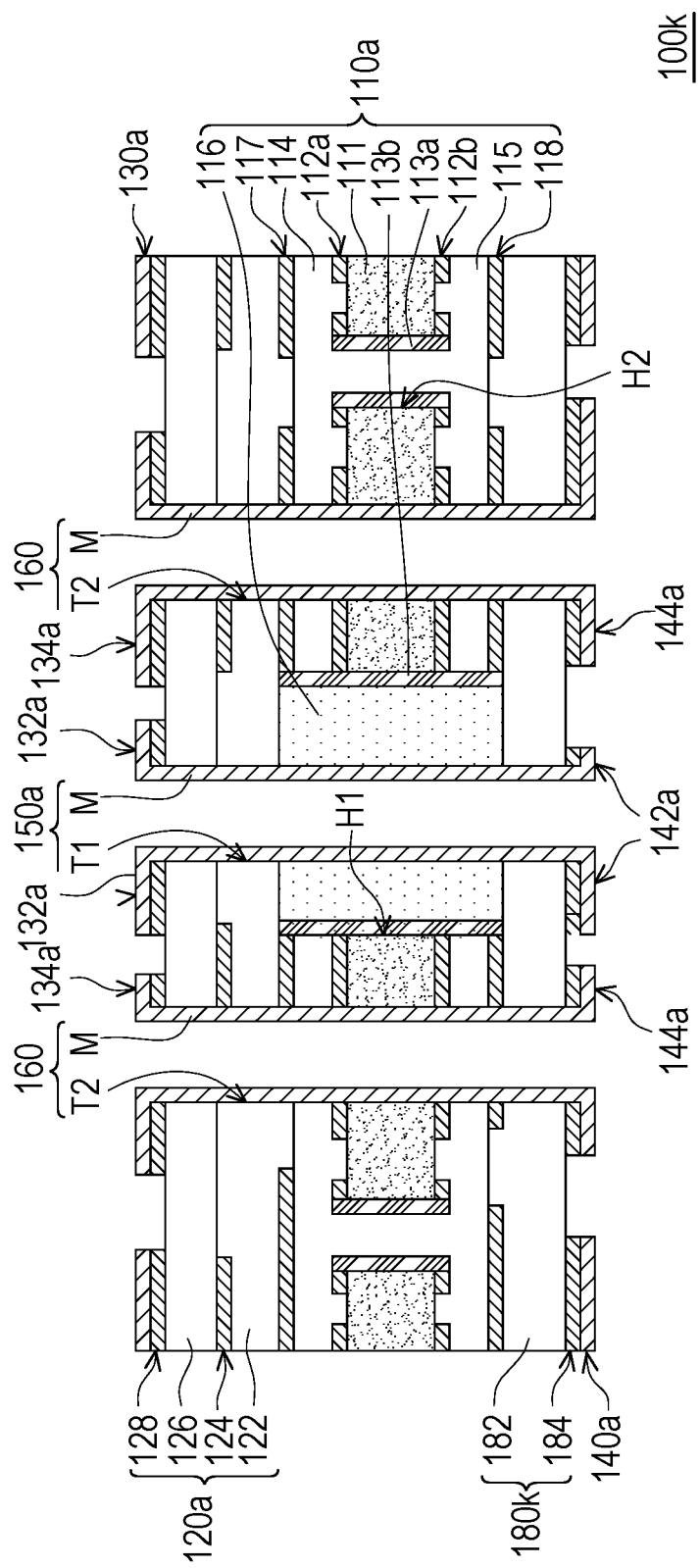
FIG. 11 is a schematic cross-sectional view of a circuit board structure according to another embodiment of the invention.

FIG. 11 is a schematic cross-sectional view of a circuit board structure according to another embodiment of the invention. Please refer to FIG. 1A and FIG. 11 at the same time, a circuit board structure 100k of the present embodiment is similar to the circuit board structure 100a, and the difference between the two is: in the present embodiment, the circuit board structure 100k further includes a second build-up structure layer 180k disposed on the second circuit layer 118 and a portion of the third dielectric layer 116, wherein the second build-up structure layer 180k includes the sixth dielectric layer 182 and the fifth circuit layer 184 disposed on the sixth dielectric layer 182, and the second external circuit layer 140a is located on the fifth circuit layer 184.

Figure 12:
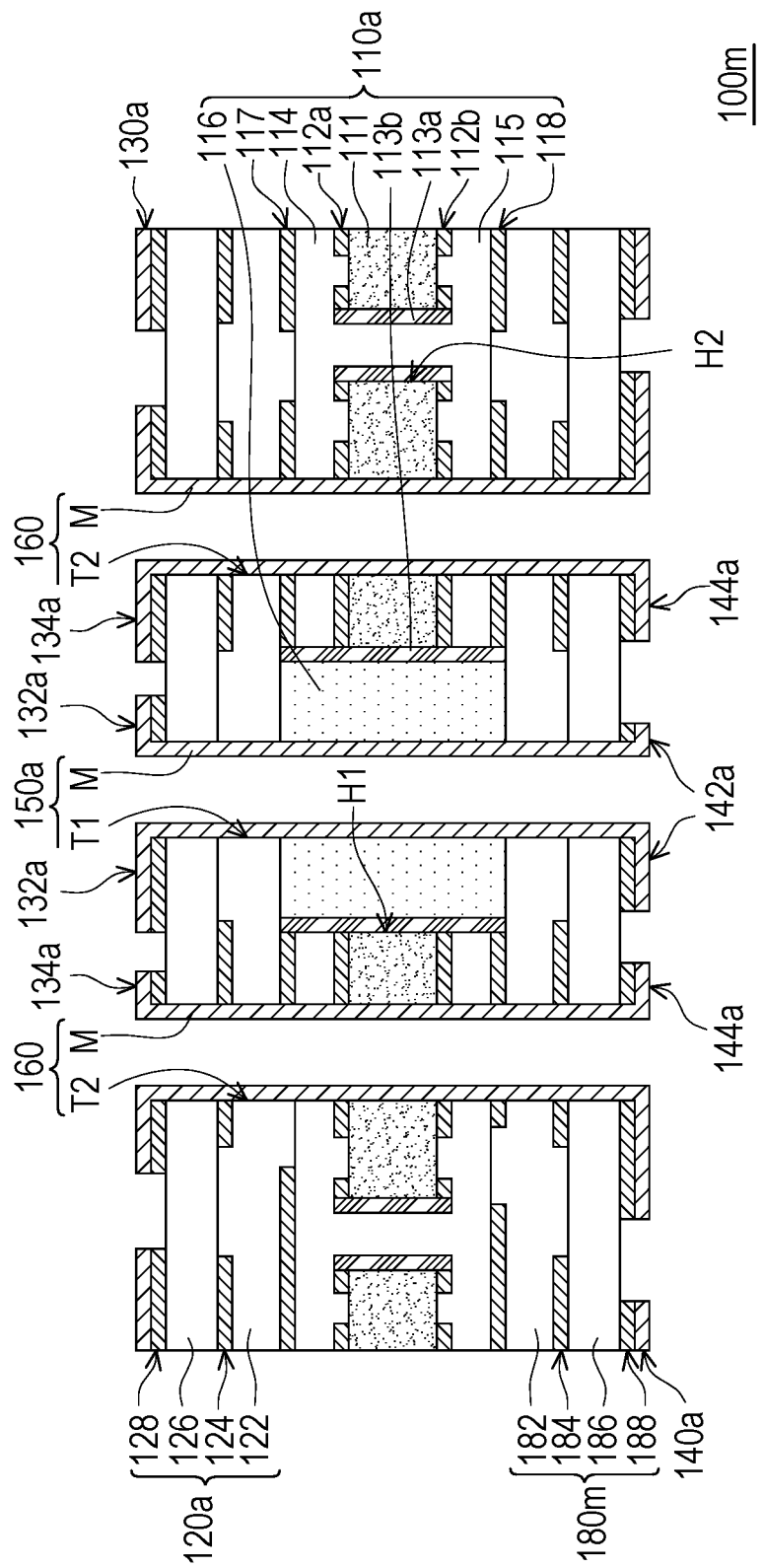
FIG. 12 is a schematic cross-sectional view of a circuit board structure according to another embodiment of the invention.

FIG. 12 is a schematic cross-sectional view of a circuit board structure according to another embodiment of the invention. Please refer to FIG. 11 and FIG. 12 at the same time. A circuit board structure 100m of the present embodiment is similar to the circuit board structure 100k, and the difference between the two is: in the present embodiment, the second build-up structure layer 180m includes the sixth dielectric layer 182, the fifth circuit layer 184, a seventh dielectric layer 186, and a sixth circuit layer 188. The sixth dielectric layer 182 is disposed on the second circuit layer 118 and the third dielectric layer 116. The fifth circuit layer 184 is disposed on the sixth dielectric layer 182, and the seventh dielectric layer 186 is disposed on the fifth circuit layer 184 and the sixth dielectric layer 182. The sixth circuit layer 188 is disposed on the seventh dielectric layer 186, and the second external circuit layer 140a is disposed on the sixth circuit layer 188.

Figure 13:
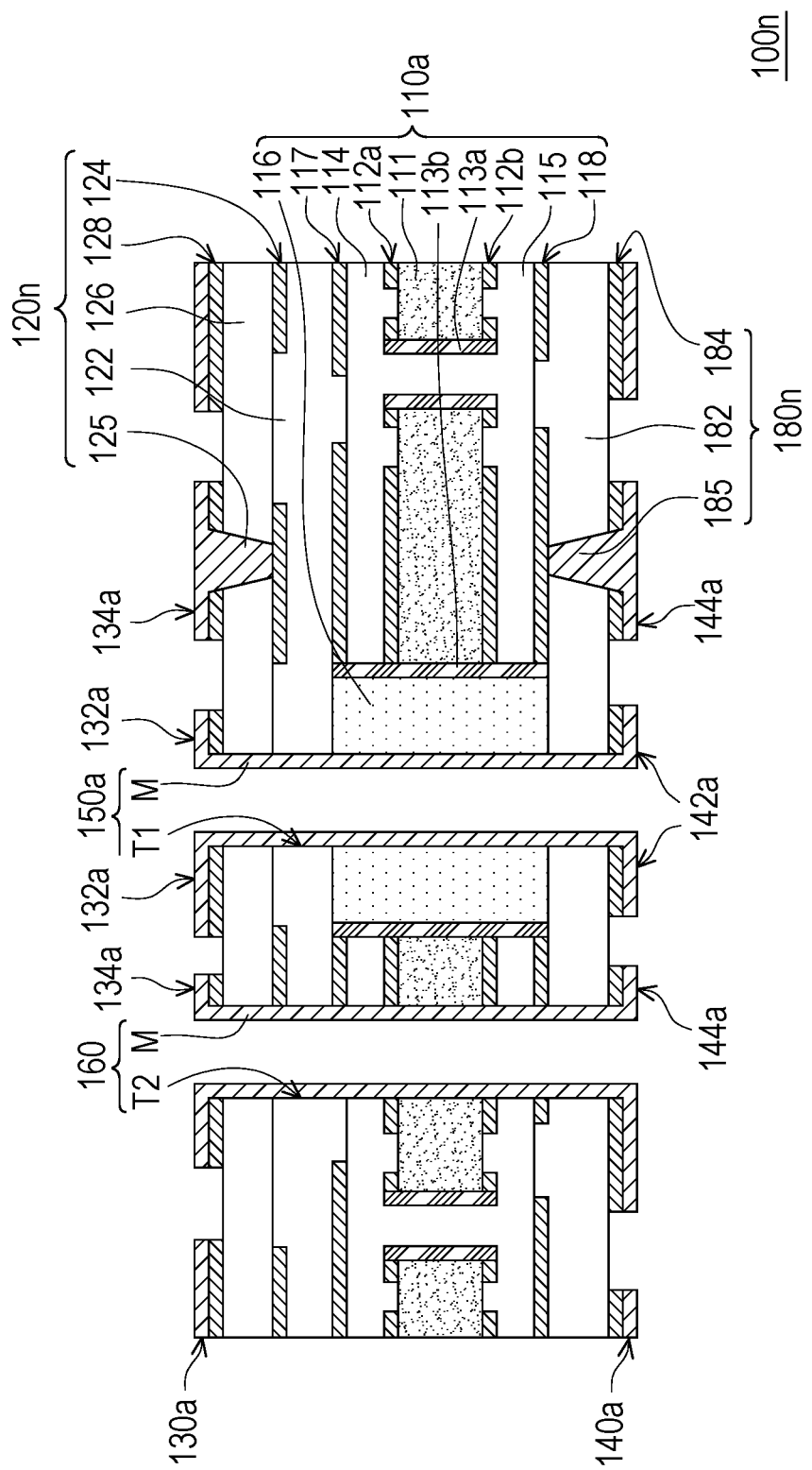
FIG. 13 is a schematic cross-sectional view of a circuit board structure according to another embodiment of the invention.

FIG. 13 is a schematic cross-sectional view of a circuit board structure according to another embodiment of the invention. In order to achieve the object of impedance matching, the layout of the ground circuit may be designed not only in the design of a through hole, but also in the design of a blind hole. Please refer to FIG. 11 and FIG. 13 at the same time, a circuit board structure 100n of the present embodiment is similar to the circuit board structure 100k, and the difference between the two is: in the present embodiment, a first build-up structure layer 120n further includes at least one first conductive blind hole 125, wherein the first conductive blind hole 125 penetrates the fourth circuit layer 128 and the fifth dielectric layer 126 and is electrically connected to the first external circuit layer 130a, the fourth circuit layer 128, and the third circuit layer 124. The second build-up structure layer 180n further includes at least one second conductive blind hole 185, wherein the second conductive blind hole 185 penetrates the fifth circuit layer 184 and the sixth dielectric layer 182 and is electrically connected to the second external circuit layer 140a, the fifth circuit layer 184, and the second circuit layer 118.

Figure 14:
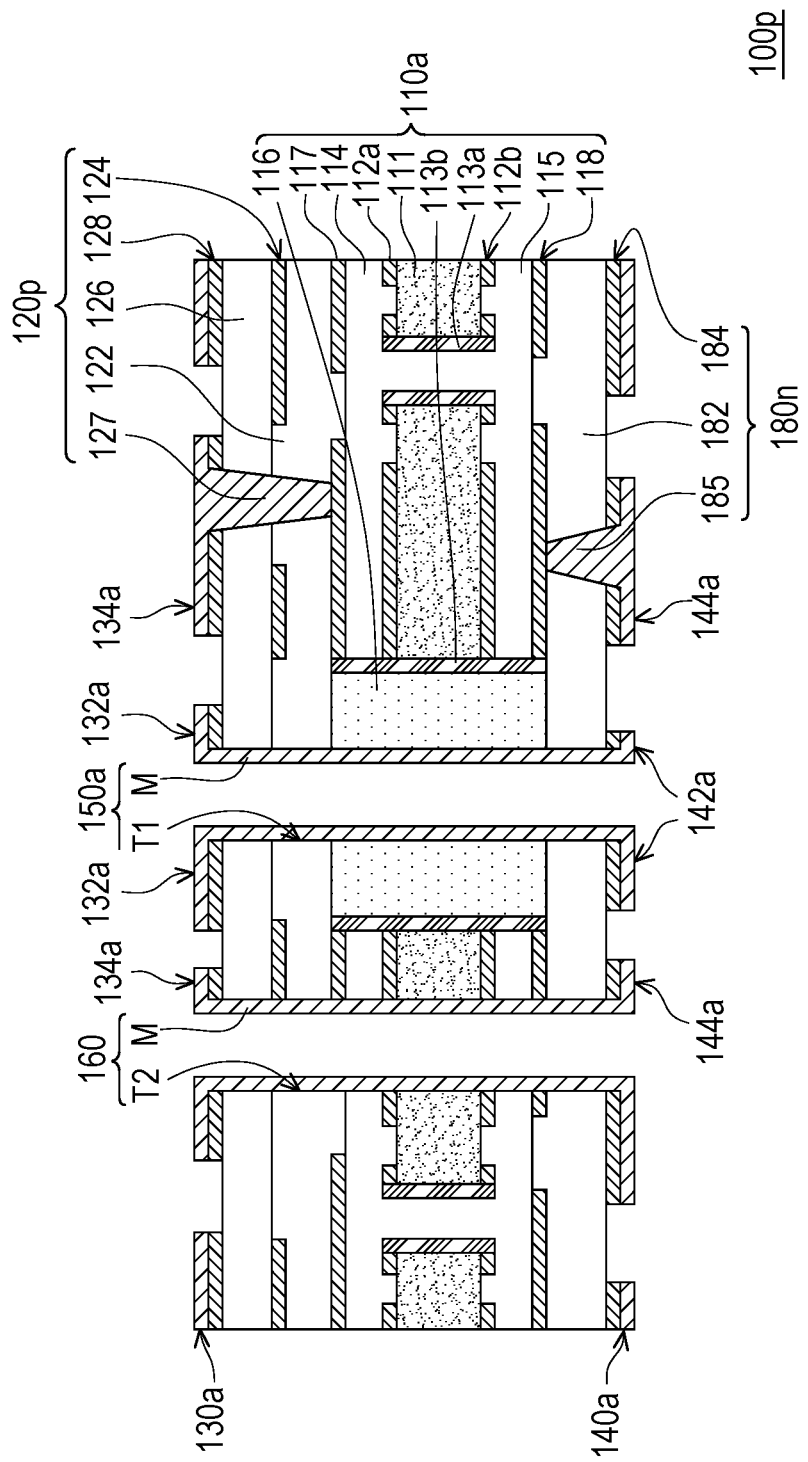
FIG. 14 is a schematic cross-sectional view of a circuit board structure according to another embodiment of the invention.

FIG. 14 is a schematic cross-sectional view of a circuit board structure according to another embodiment of the invention. Please refer to FIG. 13 and FIG. 14 at the same time, a circuit board structure 100p of the present embodiment is similar to the circuit board structure 100n, and the difference between the two is: in the present embodiment, the first conductive blind hole 127 of the first build-up structure layer 120p penetrates the fourth circuit layer 128, the fifth dielectric layer 126, and the fourth dielectric layer 122 and is electrically connected to the first external circuit layer 130a, the fourth circuit layer 128, and the first circuit layer 117 of the substrate 110a.

Figure 15A:
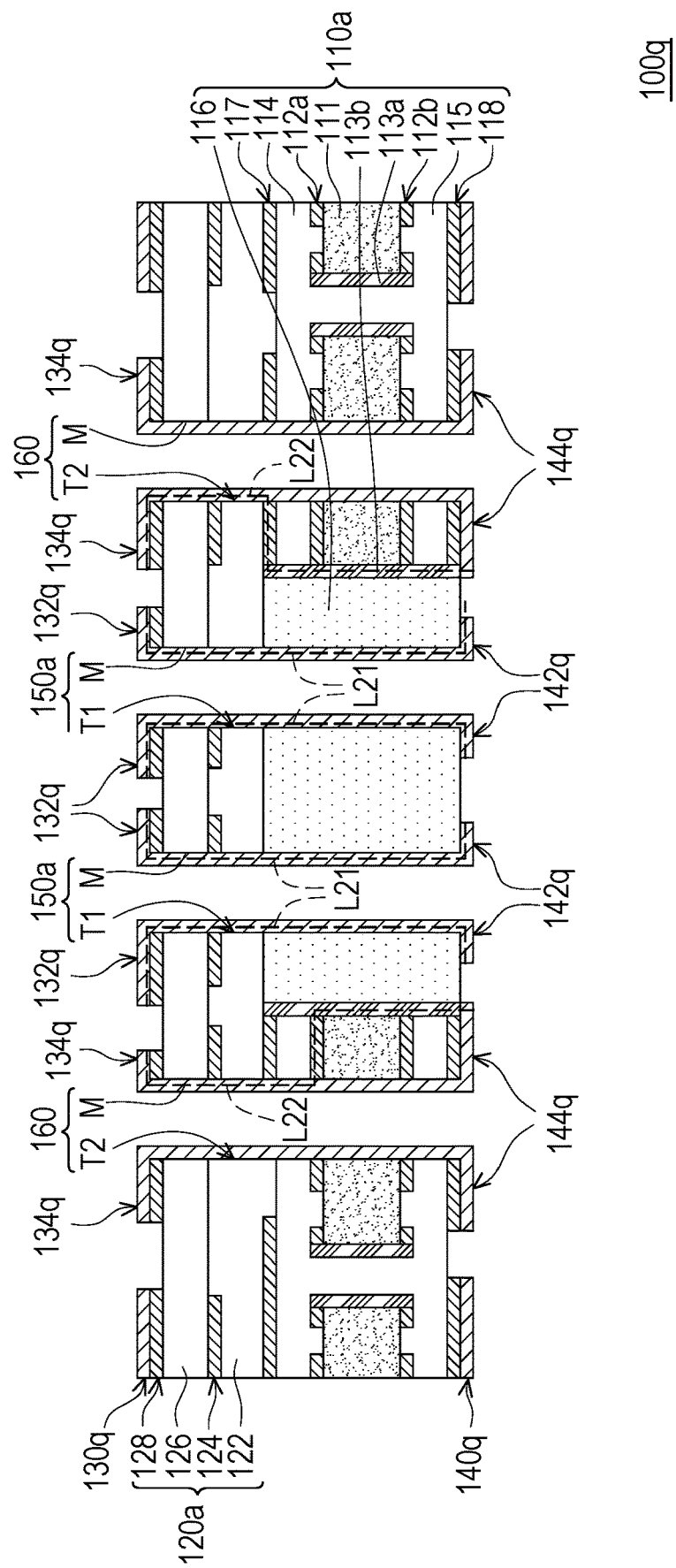
FIG. 15A is a schematic cross-sectional view of a circuit board structure according to another embodiment of the invention.
Figure 15B:
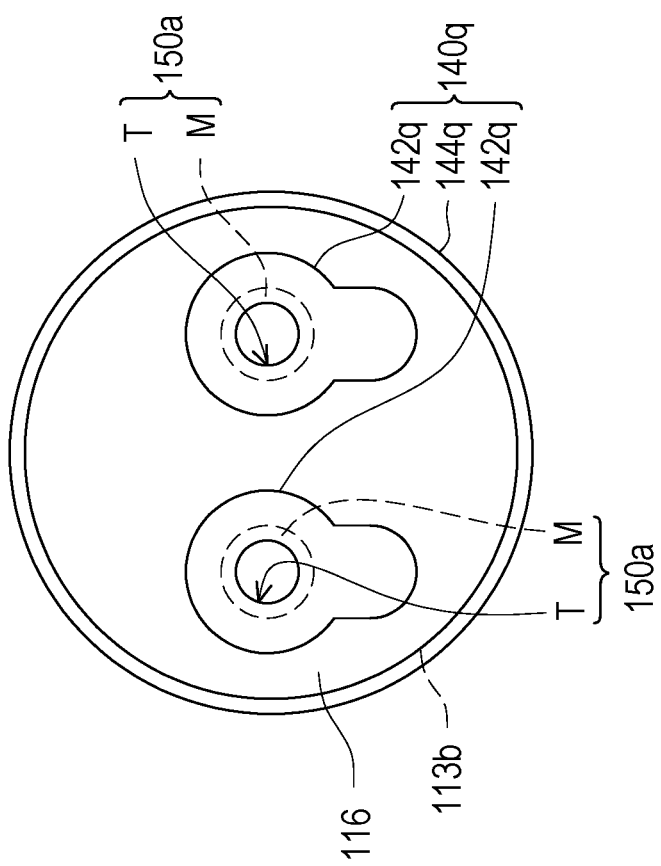
FIG. 15B is a partial bottom schematic view of the circuit board structure of FIG. 15A.

FIG. 15A is a schematic cross-sectional view of a circuit board structure according to another embodiment of the invention. FIG. 15B is a partial bottom schematic view of the circuit board structure of FIG. 15A. Referring to FIG. 1A, FIG. 1B, FIG. 15A, and FIG. 15B at the same time, a circuit board structure 100q of the present embodiment is similar to the circuit board structure 100a, and the difference between the two is: in the present embodiment, the circuit board structure 100q includes two first conductive vias 150a. A first signal circuit 132q, the two first conductive vias 150a, and a second signal circuit 142q define two signal paths L21. The first ground circuit 134q, each of the second conductive vias 160, the first circuit layer 117, the outer conductive layer 113b, and the second ground circuit 144q define the ground path L22. Here, the circuit board structure 100q is a ground/signal/signal/ground (GSSG) design. Since the two signal paths L21 are surrounded by the ground path L22 and enclosed in a closed manner, a good high-frequency high-speed loop may be formed.

Figure 16:
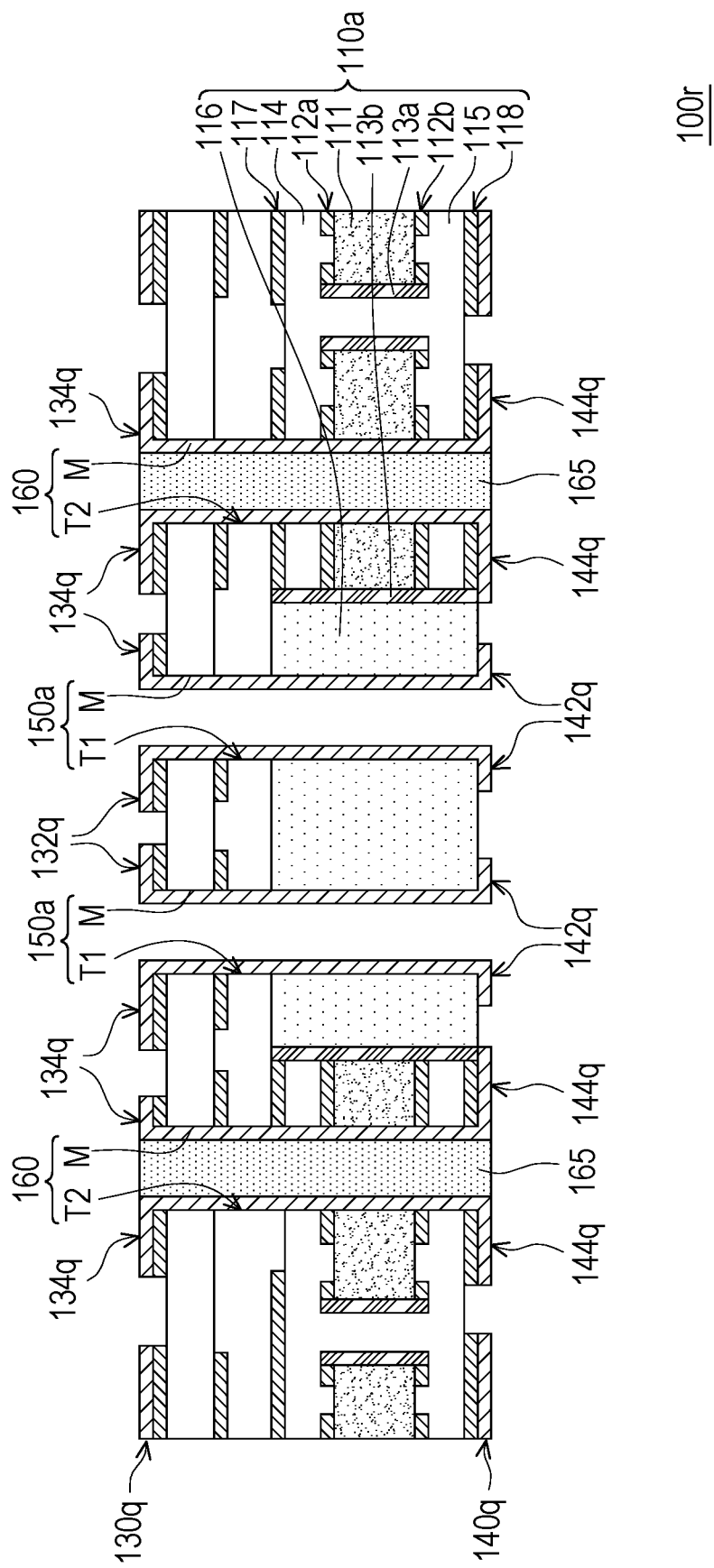
FIG. 16 is a schematic cross-sectional view of a circuit board structure according to another embodiment of the invention.

FIG. 16 is a schematic cross-sectional view of a circuit board structure according to another embodiment of the invention. Please refer to FIG. 15A and FIG. 16 at the same time, a circuit board structure 100r of the present embodiment is similar to the circuit board structure 100q, and the difference between the two is: in the present embodiment, the circuit board structure 100r further includes the hole filling material 165, wherein the hole filling material 165 completely fills the second conductive vias 160, and two opposite sides of the hole filling material 165 may be aligned with a first external circuit layer 130q and a second external circuit layer 140q, respectively. Here, the hole filling material 165 is not filled in the two first conductive vias 150a. Here, the material of the hole filling material 165 is, for example, resin, which may be regarded as a hole plugging agent, or a dielectric material with a dielectric constant greater than 3.6 and a dielectric loss lower than 0.05.

Figure 17:
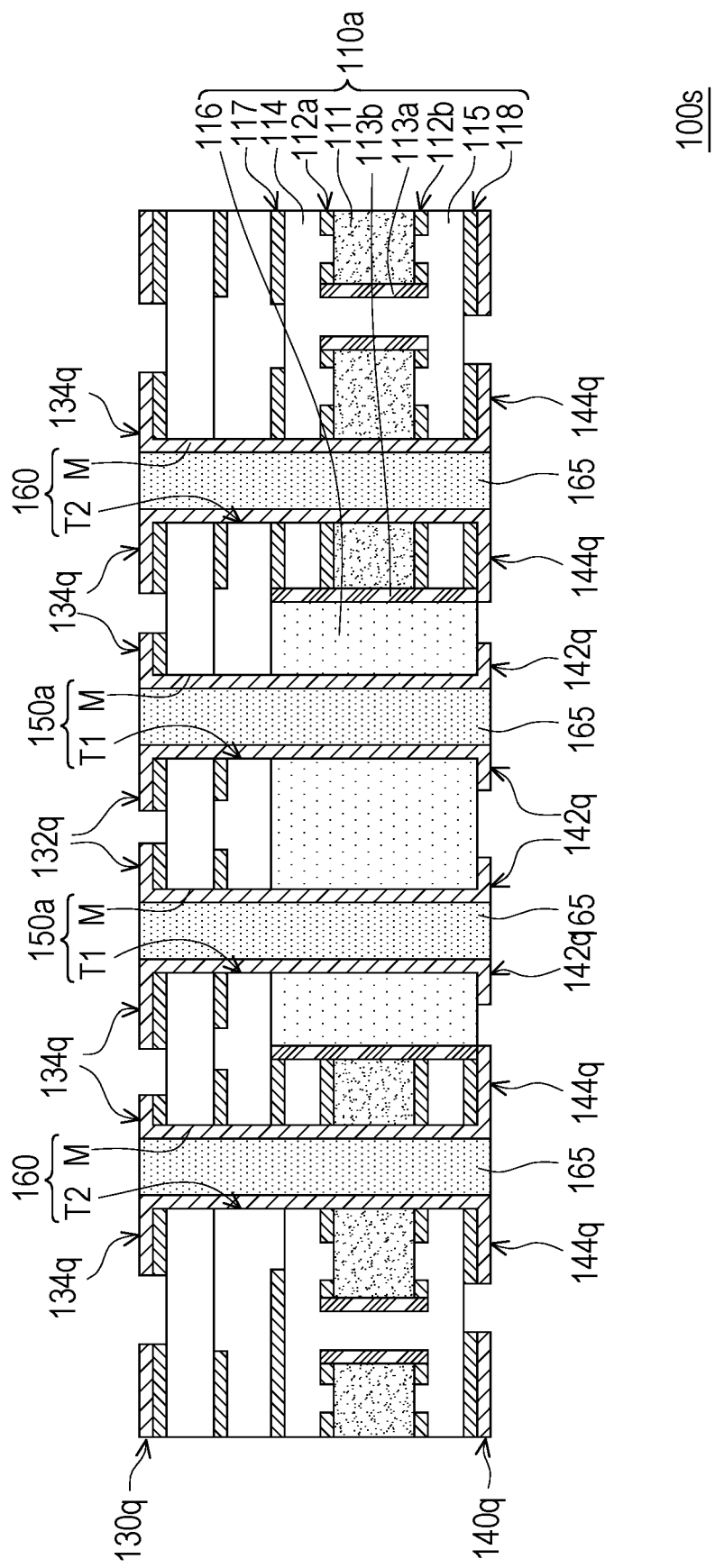
FIG. 17 is a schematic cross-sectional view of a circuit board structure according to another embodiment of the invention.

FIG. 17 is a schematic cross-sectional view of a circuit board structure according to another embodiment of the invention. Please refer to FIG. 15A and FIG. 17 at the same time, a circuit board structure 100s of the present embodiment is similar to the circuit board structure 100q, and the difference between the two is: in the present embodiment, the circuit board structure 100s further includes the hole filling material 165, wherein the hole filling material 165 completely fills the two first conductive vias 150a and the second conductive vias 160, and two opposite sides of the hole filling material 165 may be aligned with the first external circuit layer 130q and the second external circuit layer 140q, respectively. Here, the material of the hole filling material 165 is, for example, resin, which may be regarded as a hole plugging agent, or a dielectric material with a dielectric constant greater than 3.6 and a dielectric loss lower than 0.05.

Figure 18:
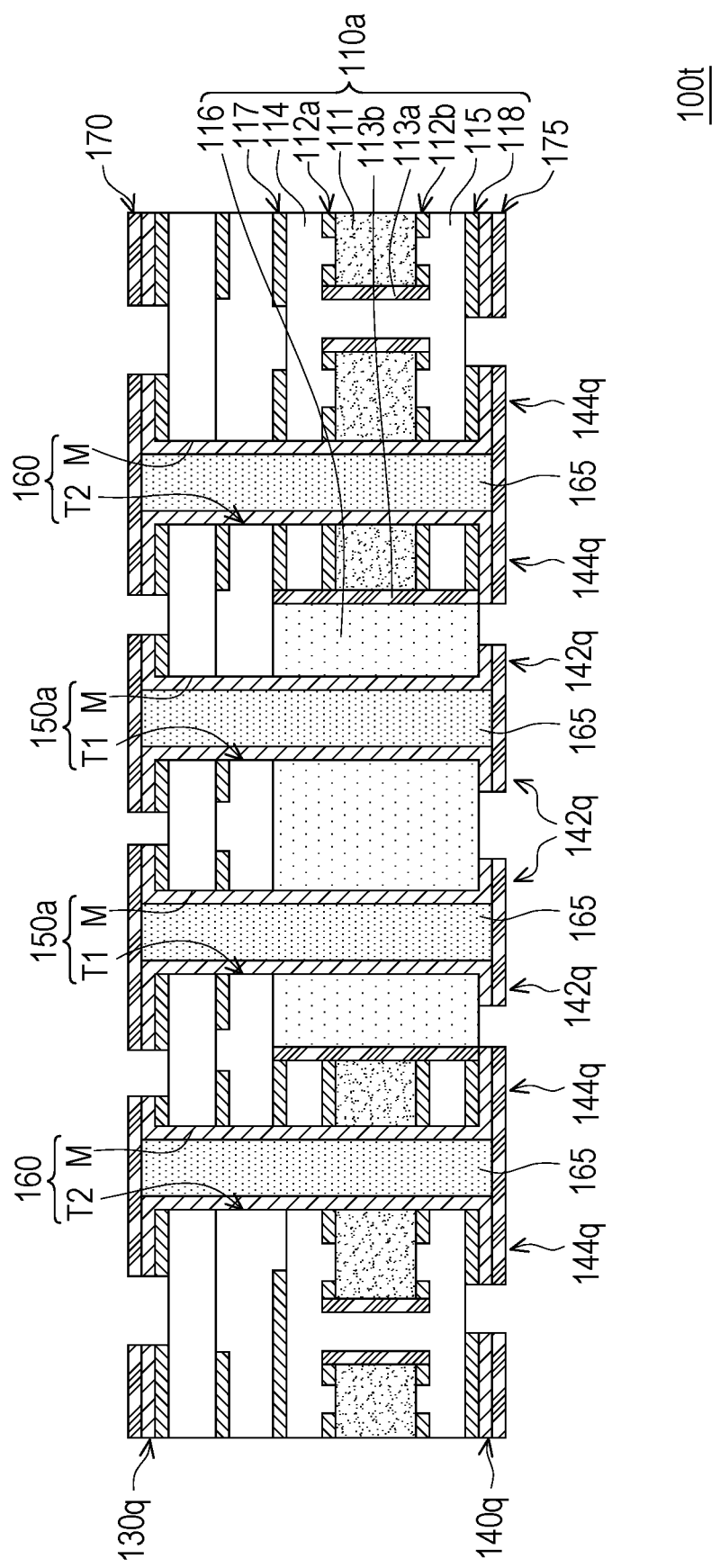
FIG. 18 is a schematic cross-sectional view of a circuit board structure according to another embodiment of the invention.

FIG. 18 is a schematic cross-sectional view of a circuit board structure according to another embodiment of the invention. Referring to both FIG. 17 and FIG. 18, a circuit board structure 100t of the present embodiment is similar to the circuit board structure 100s, and the difference between the two is: in the present embodiment, the circuit board structure 100t further includes the first cover layer 170 and the second cover layer 175. The first cover layer 170 covers the first external circuit layer 130q. The second cover layer 175 covers the second external circuit layer 140q, wherein the first cover layer 170 and the second cover layer 175 cover two opposite ends of the hole filling material 165 respectively. Here, the material of the first cover layer 170 and the material of the second cover layer 175 may be, for example, copper, but not limited thereto.

Figure 19:
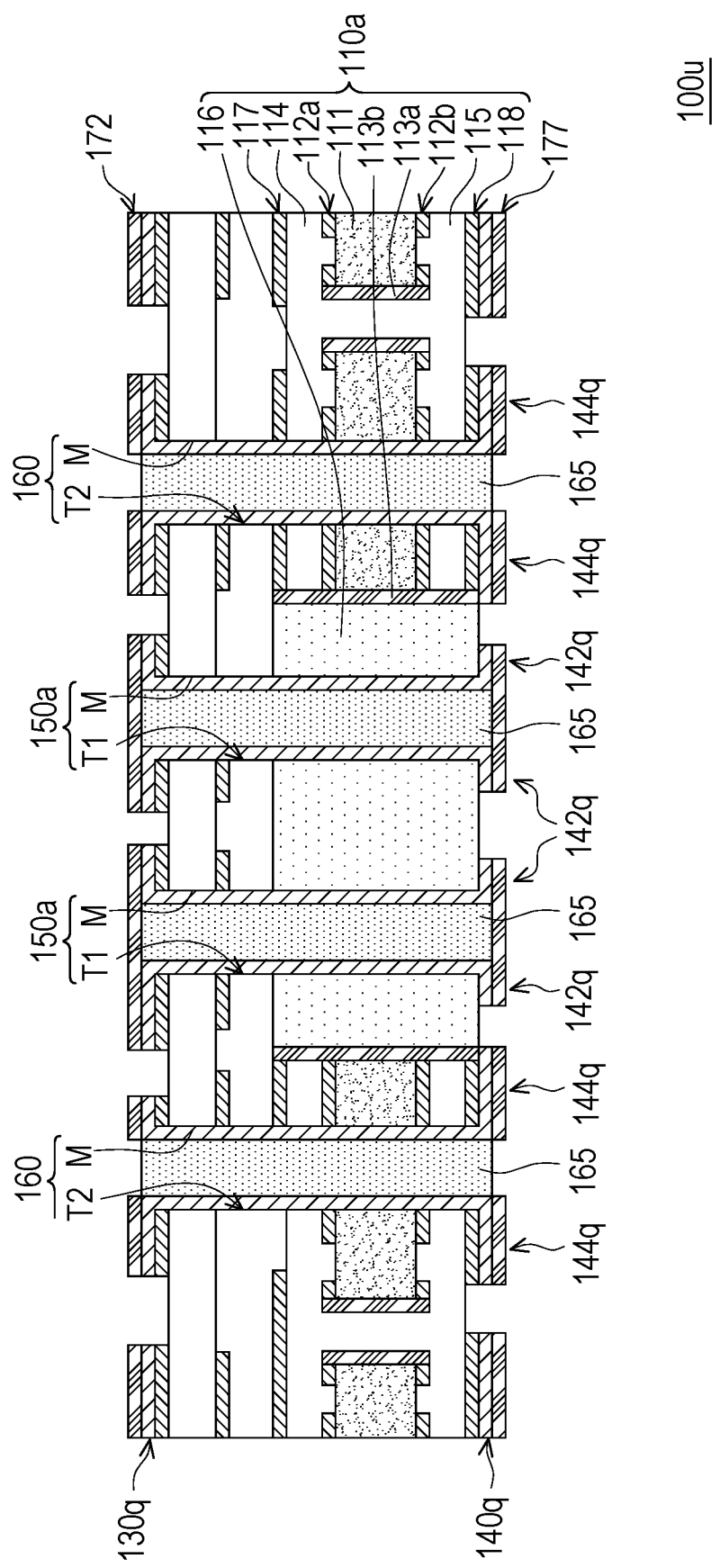
FIG. 19 is a schematic cross-sectional view of a circuit board structure according to another embodiment of the invention.

FIG. 19 is a schematic cross-sectional view of a circuit board structure according to another embodiment of the invention. Referring to both FIG. 17 and FIG. 19, a circuit board structure 100u of the present embodiment is similar to the circuit board structure 100s, and the difference between the two is: in the present embodiment, the circuit board structure 100u further includes the first cover layer 172 and the second cover layer 177. The first cover layer 172 covers the first external circuit layer 130q, and the second cover layer 177 covers the second external circuit layer 140q, wherein the first cover layer 172 and the second cover layer 177 respectively cover two ends of the hole filling material 165 opposite to each other completely filling the two first conductive vias 150a, and expose two ends of the hole filling material 165 located in the second conductive vias 160. Here, the material of the first cover layer 172 and the material of the second cover layer 177 may be, for example, copper, but not limited thereto.

Figure 20:
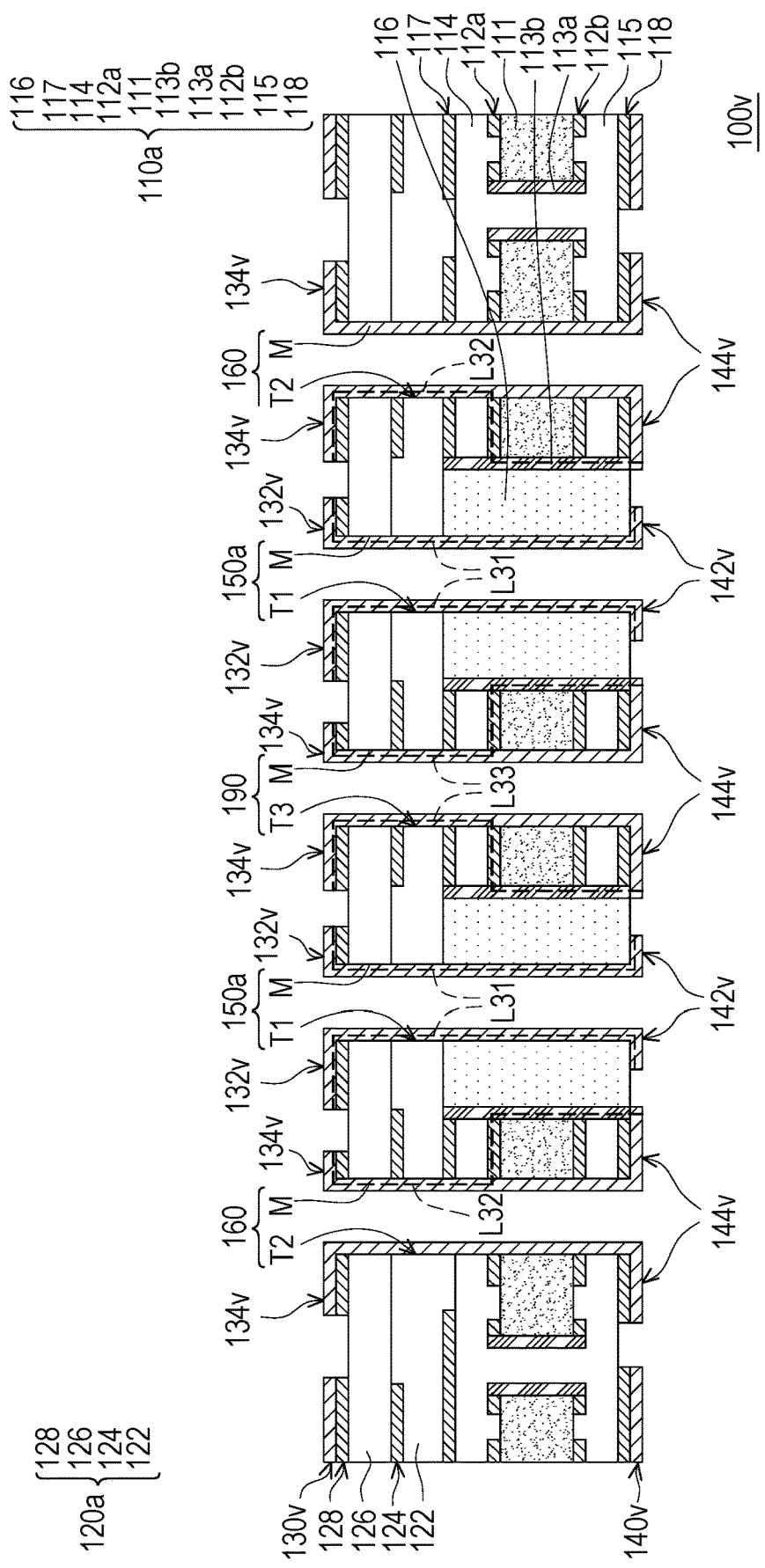
FIG. 20 is a schematic cross-sectional view of a circuit board structure according to another embodiment of the invention.

FIG. 20 is a schematic cross-sectional view of a circuit board structure according to another embodiment of the invention. Please refer to FIG. 15A and FIG. 20 at the same time, a circuit board structure 100v of the present embodiment is similar to the circuit board structure 100q, and the difference between the two is: in the present embodiment, the circuit board structure 100v further includes a third conductive via 190 penetrating the first build-up structure layer 120a, the first circuit layer 117, the first dielectric layer 114, the first inner circuit layer 112a, the core layer 111, the second inner circuit layer 112b, the second dielectric layer 115, and the second circuit layer 118, and structurally and electrically connected to a first external circuit layer 130v, the fourth circuit layer 128, the third circuit layer 124, the first circuit layer 117, the first inner circuit layer 112a, the second inner circuit layer 112b, the second circuit layer 118, and a second external circuit layer 140v. Here, the third conductive via 190 is located between the first conductive vias 150a, and a first signal circuit 132v, the third conductive via 190, the first circuit layer 117, the outer conductive layer 113b, and a second signal circuit 144v define a ground path L33 (i.e., the second ground path), and the signal path L31 is located between the ground path L32 and the ground path L33. The signal path L31 defined by the first signal circuit 132v, the first conductive vias 150a, and the second signal circuit 142v is surrounded and enclosed in a closed manner by the ground path L32 defined by a first ground circuit 134v, the second conductive vias 160, the first circuit layer 117, the outer conductive layer 113b, and the second ground circuit 144q and the ground path L33 defined by the first ground circuit 134v, the third conductive via 190, the first circuit layer 117, the outer conductive layer 113b, and the second ground circuit 144q, and therefore may form a good high-frequency high-speed loop. Here, the circuit board structure 100v is a ground/signal/ground/signal/ground (GSGSG) design.

Figure 21:
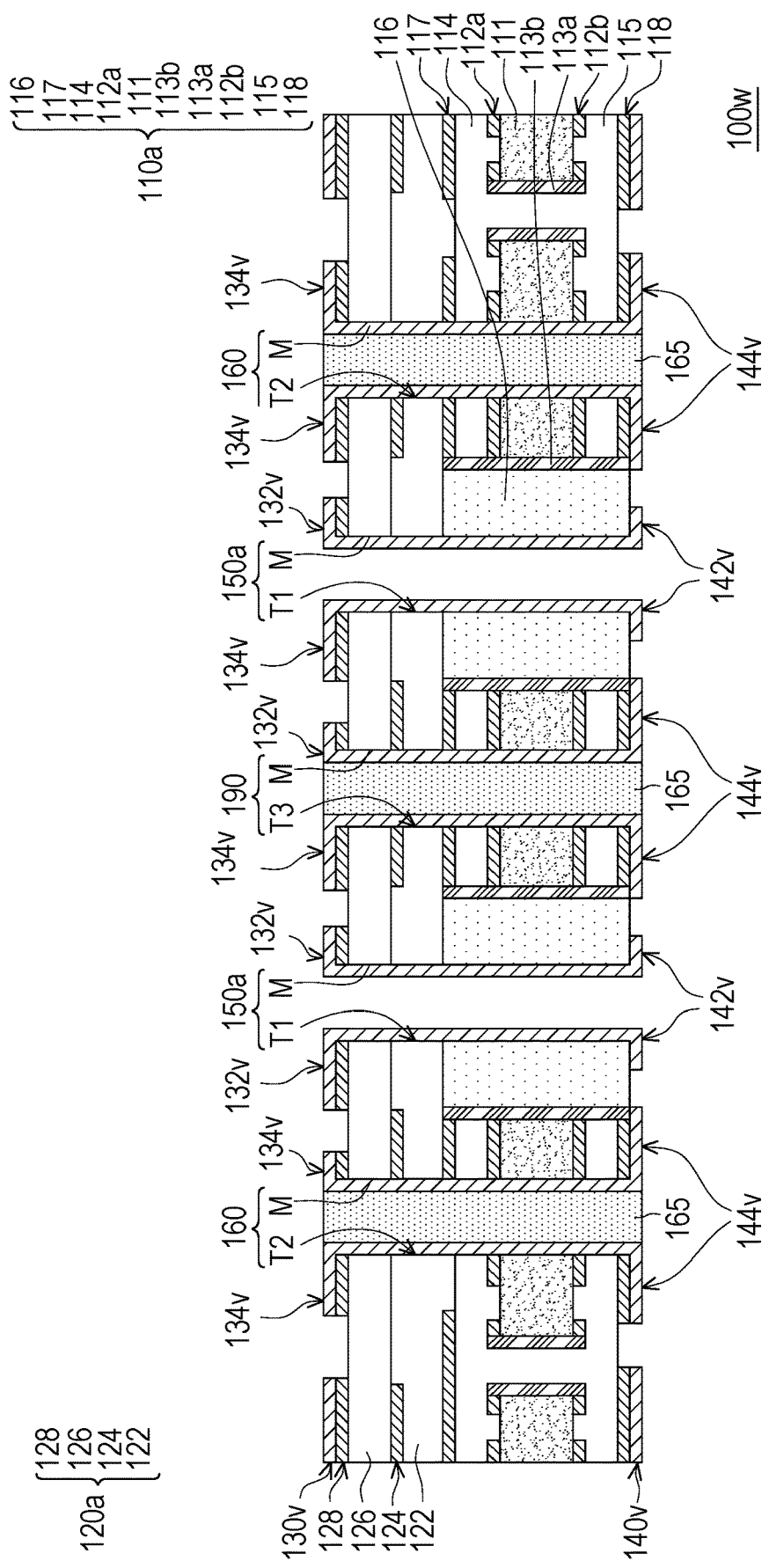
FIG. 21 is a schematic cross-sectional view of a circuit board structure according to another embodiment of the invention.

FIG. 21 is a schematic cross-sectional view of a circuit board structure according to another embodiment of the invention. Please refer to FIG. 20 and FIG. 21 at the same time, a circuit board structure 100w of the present embodiment is similar to the circuit board structure 100v, and the difference between the two is: in the present embodiment, the circuit board structure 100w further includes the hole filling material 165, wherein the hole filling material 165 completely fills the second conductive vias 160 and the third conductive via 190, and two opposite sides of the hole filling material 165 may be aligned with the first external circuit layer 130v and the second external circuit layer 140v, respectively. Here, the hole filling material 165 is not filled in the first conductive vias 150a. Here, the material of the hole filling material 165 is, for example, resin, which may be regarded as a hole plugging agent, or a dielectric material with a dielectric constant greater than 3.6 and a dielectric loss lower than 0.05.

Figure 22:
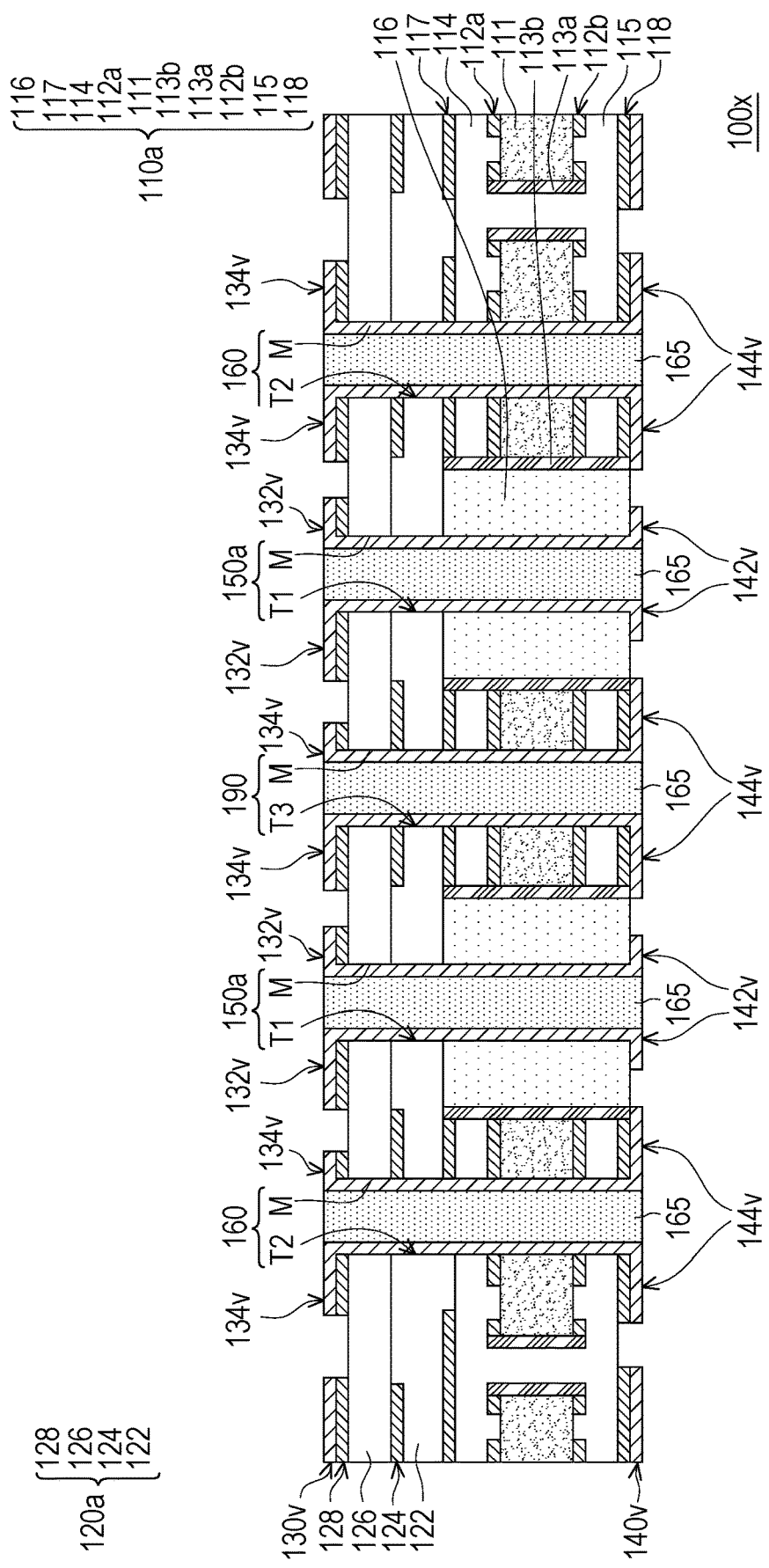
FIG. 22 is a schematic cross-sectional view of a circuit board structure according to another embodiment of the invention.

FIG. 22 is a schematic cross-sectional view of a circuit board structure according to another embodiment of the invention. Please refer to FIG. 20 and FIG. 22 at the same time, a circuit board structure 100x of the present embodiment is similar to the circuit board structure 100v, and the difference between the two is: in the present embodiment, the circuit board structure 100x further includes the hole filling material 165, wherein the hole filling material 165 completely fills the first conductive vias 150a, the second conductive vias 160, and the third conductive via 190, and two opposite sides of the hole filling material 165 may be aligned with the first external circuit layer 130v and the second external circuit layer 140v, respectively. Here, the material of the hole filling material 165 is, for example, resin, which may be regarded as a hole plugging agent, or a dielectric material with a dielectric constant greater than 3.6 and a dielectric loss lower than 0.05.

Figure 23:
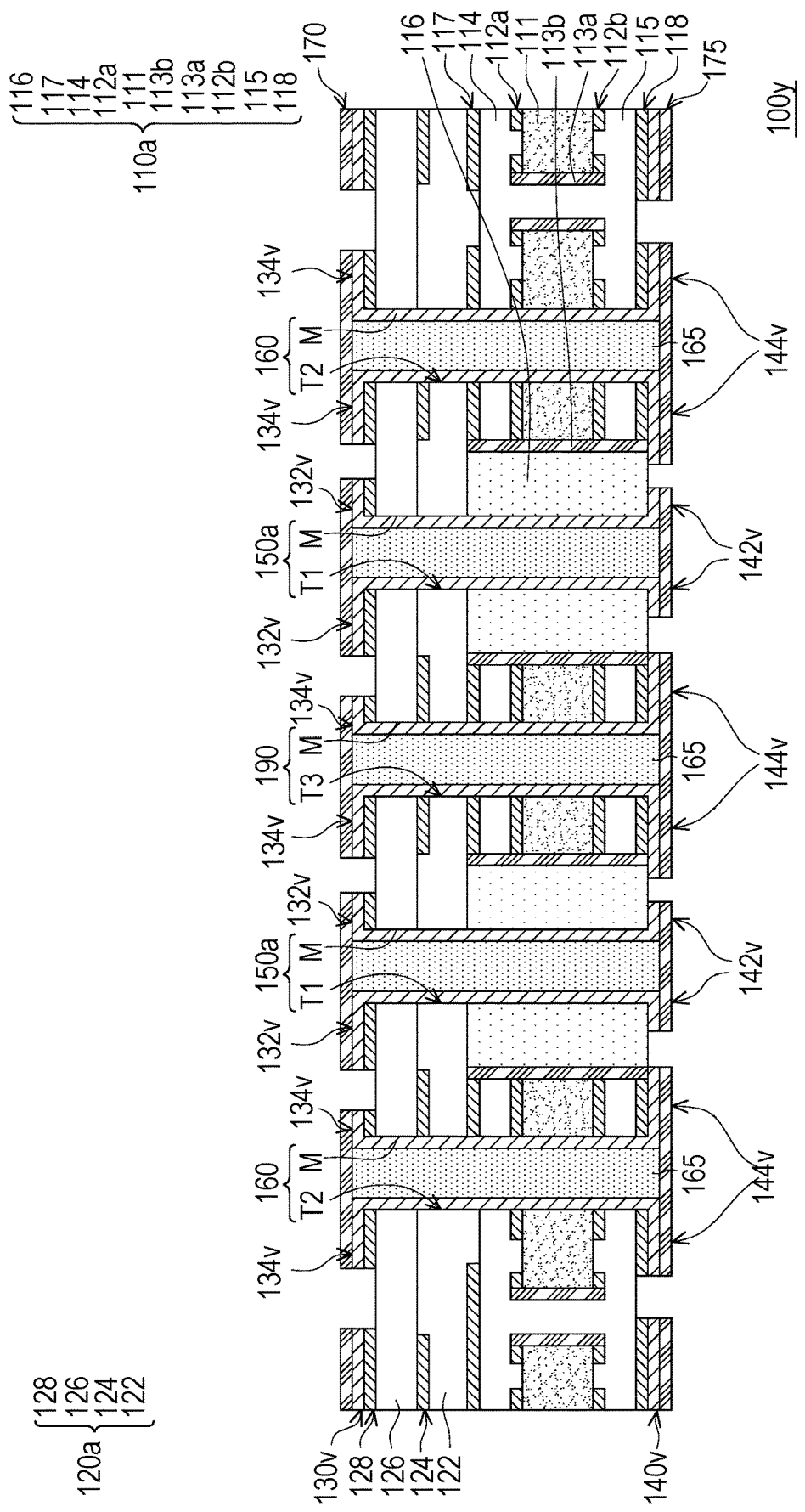
FIG. 23 is a schematic cross-sectional view of a circuit board structure according to another embodiment of the invention.

FIG. 23 is a schematic cross-sectional view of a circuit board structure according to another embodiment of the invention. Referring to both FIG. 22 and FIG. 23, a circuit board structure 100y of the present embodiment is similar to the circuit board structure 100x, and the difference between the two is: in the present embodiment, the circuit board structure 100y further includes the first cover layer 170 and the second cover layer 175. The first cover layer 170 covers the first external circuit layer 130v. The second cover layer 175 covers the second external circuit layer 140v, wherein the first cover layer 170 and the second cover layer 175 cover two opposite ends of the hole filling material 165 respectively. Here, the material of the first cover layer 170 and the material of the second cover layer 175 may be, for example, copper, but not limited thereto.

Figure 24:
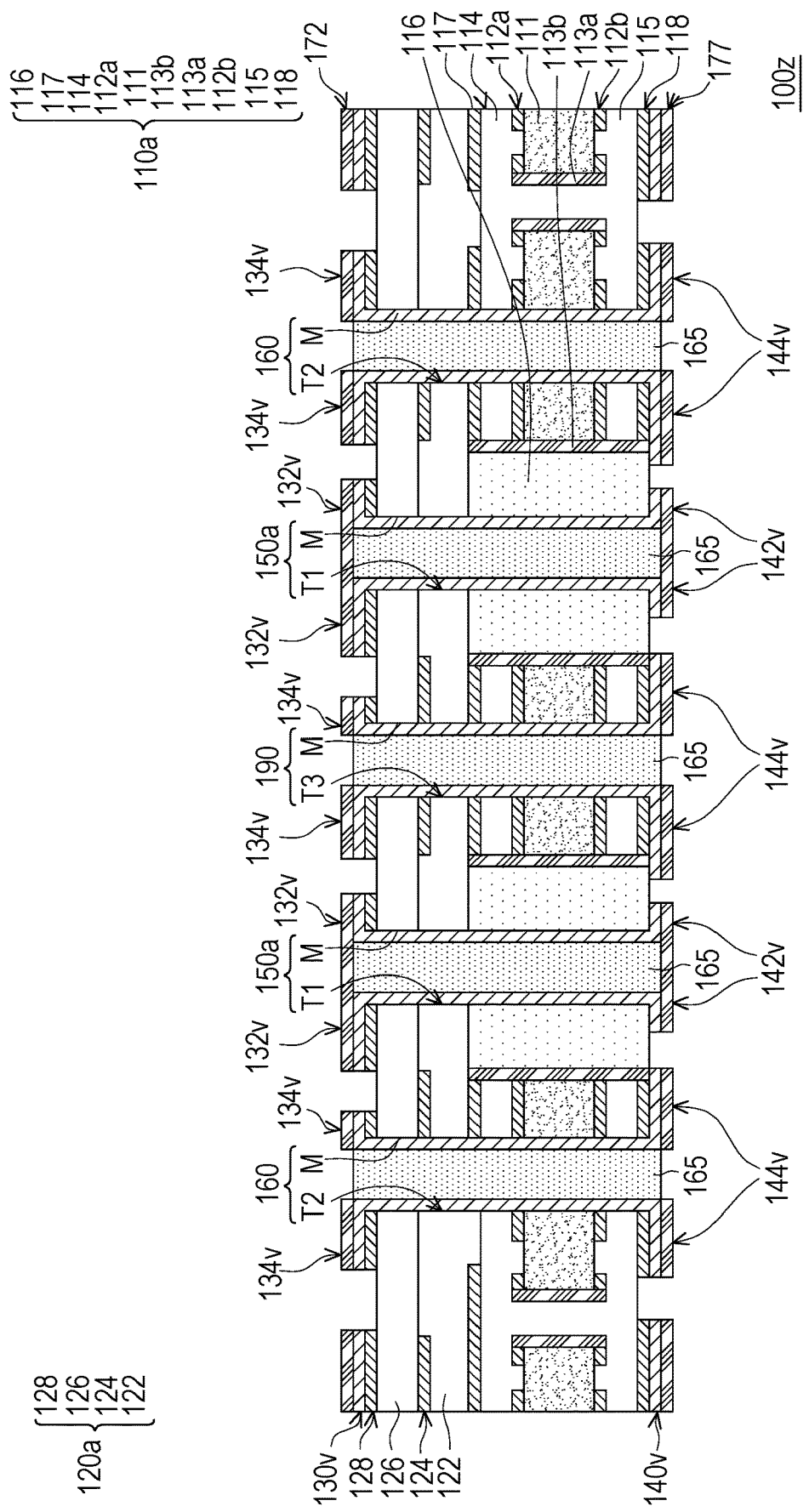
FIG. 24 is a schematic cross-sectional view of a circuit board structure according to another embodiment of the invention.

FIG. 24 is a schematic cross-sectional view of a circuit board structure according to another embodiment of the invention. Referring to both FIG. 22 and FIG. 24, a circuit board structure 100z of the present embodiment is similar to the circuit board structure 100x, and the difference between the two is: in the present embodiment, the circuit board structure 100z further includes the first cover layer 172 and the second cover layer 177. The first cover layer 172 covers the first external circuit layer 130v, and the second cover layer 177 covers the second external circuit layer 140v, wherein the first cover layer 172 and the second cover layer 177 respectively cover two ends of the hole filling material 165 opposite to each other completely filling the first conductive vias 150a, and expose two ends of the hole filling material 165 located in the second conductive vias 160. Here, the material of the first cover layer 172 and the material of the second cover layer 177 may be, for example, copper, but not limited thereto.

Figure 25A:
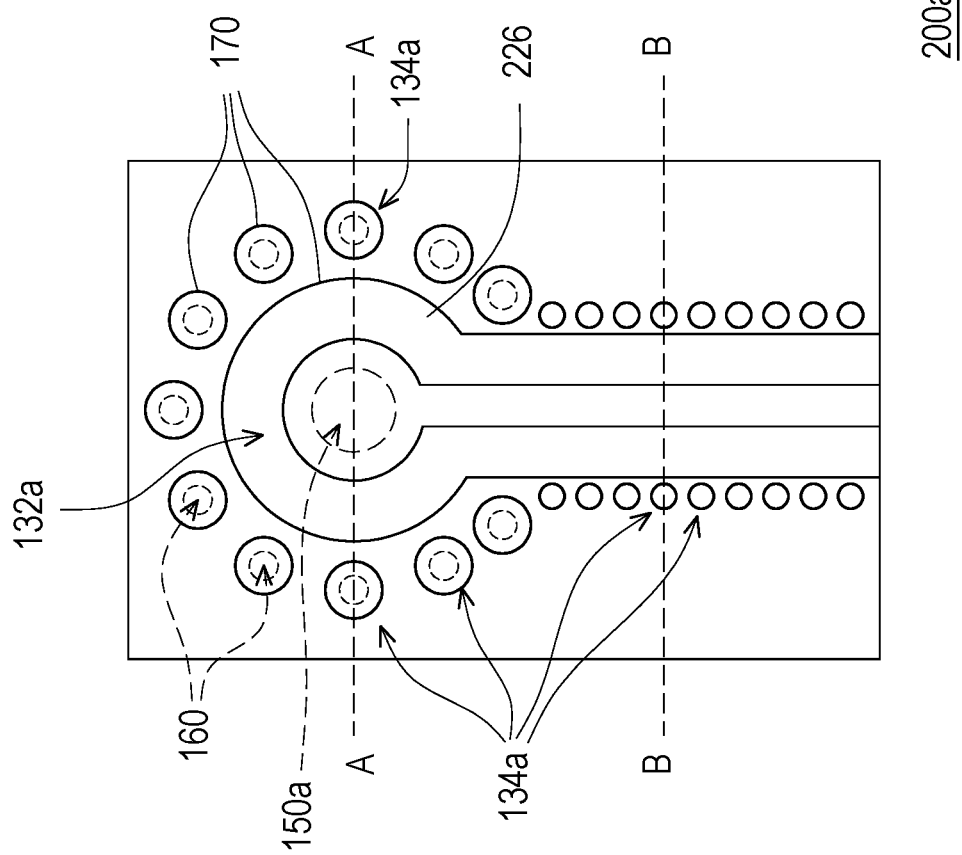
FIG. 25A is a schematic top view of a circuit board structure according to another embodiment of the invention.
Figure 25B:
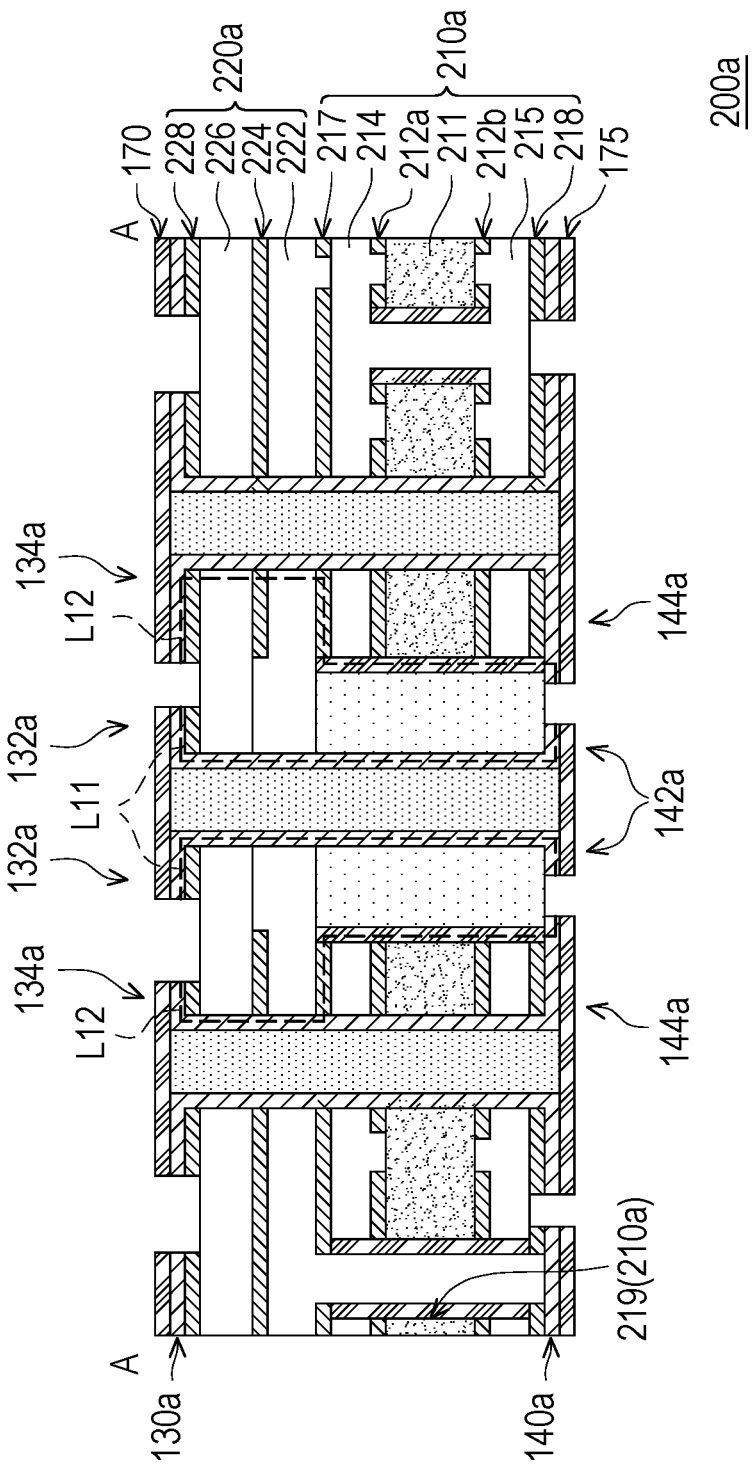
FIG. 25B is a schematic cross-sectional view along line A-A of FIG. 25A.
Figure 25C:
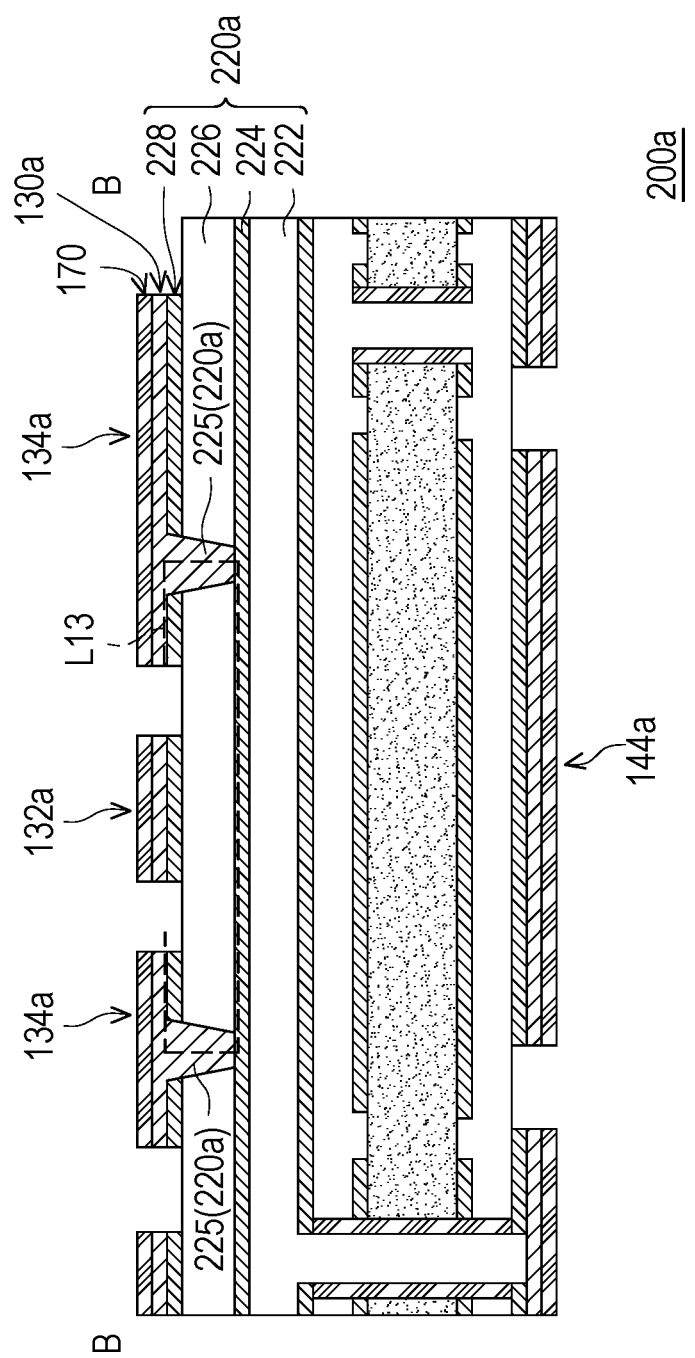
FIG. 25C is a schematic cross-sectional view along line B-B of FIG. 25A.

FIG. 25A is a schematic top view of a circuit board structure according to another embodiment of the invention. FIG. 25B is a schematic cross-sectional view along line A-A of FIG. 25A. FIG. 25C is a schematic cross-sectional view along line B-B of FIG. 25A. Please refer to FIG. 6A, FIG. 25A, and FIG. 25B at the same time. A circuit board structure 200a of the present embodiment is similar to the circuit board structure 100f, and the difference between the two is: in the present embodiment, a substrate 210a further has a third opening 219, wherein the third opening 219 penetrates a first circuit layer 217, a first dielectric layer 214, a first inner circuit layer 212a, a core layer 211, a second inner circuit layer 212b, a second dielectric layer 215, and a second circuit layer 218, and communicates with a fourth dielectric layer 222 and the second external circuit layer 140a. Moreover, referring to FIG. 25C, a first build-up structure layer 220a of the present embodiment further includes at least one first conductive blind hole 225, wherein the first conductive blind hole 225 penetrates a fourth circuit layer 228 and a fifth dielectric layer 226 and is electrically connected to the first external circuit layer 130a, the fourth circuit layer 228, and a third circuit layer 224, so as to achieve the object of impedance matching. In addition, the first ground circuit 134a, the first conductive blind hole 225, and the third circuit layer 224 define a ground path L13, and the ground path L13 surrounds the first signal circuit 132a and is enclosed in a closed manner, and therefore a good high-frequency high-speed loop may be formed. Here, one side of the circuit board structure 200a is a fan-out design.

Figure 26:
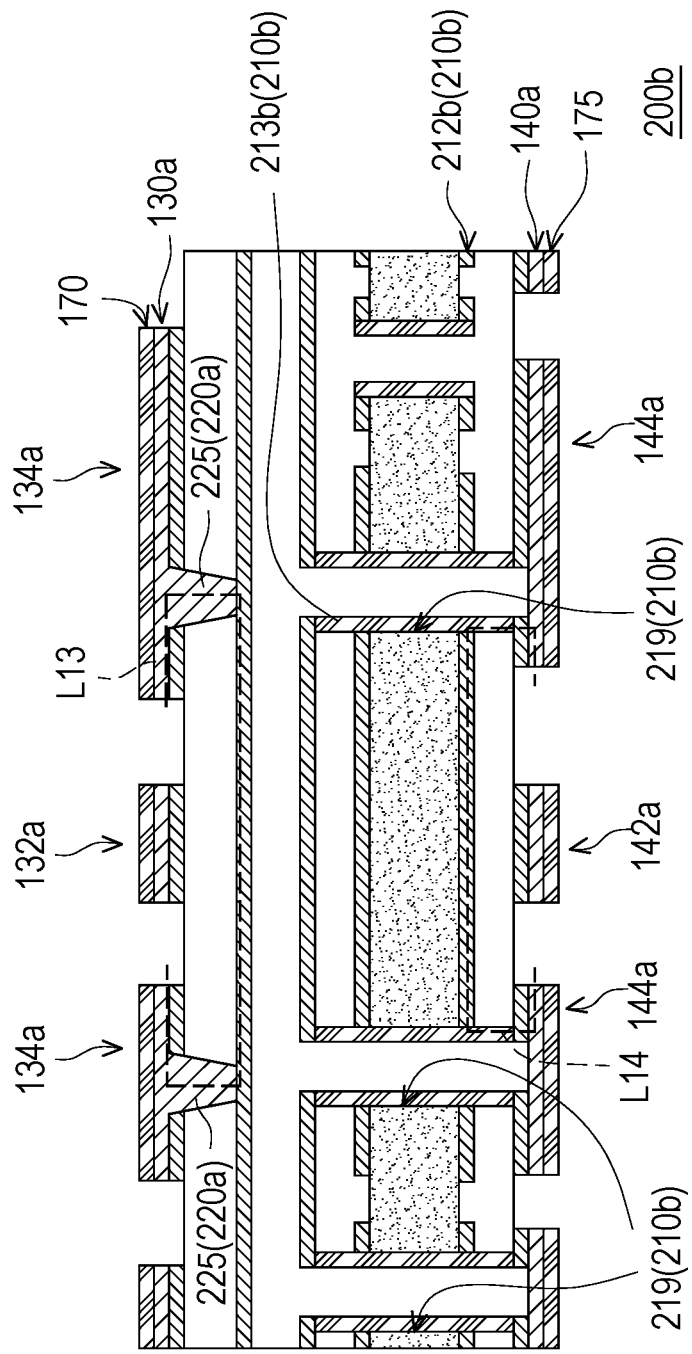
FIG. 26 is a schematic cross-sectional view of a circuit board structure according to another embodiment of the invention.

FIG. 26 is a schematic cross-sectional view of a circuit board structure according to another embodiment of the invention. Please refer first to FIG. 25C and FIG. 26 at the same time. A circuit board structure 200b of the present embodiment is similar to the circuit board structure 200a, and the difference between the two is: in the present embodiment, a substrate 210b further has a plurality of third openings 219, wherein the second ground circuit 144a, an outer conductive layer 213b, and the second inner circuit layer 212b define a ground path L14, and the ground path L14 surrounds the second signal circuit 142a and encloses the second signal circuit 142a in a closed manner, and therefore a good high-frequency high-speed loop may be formed. Here, the two opposite sides of the circuit board structure 200b are both fan-out designs.

Figure 27A:
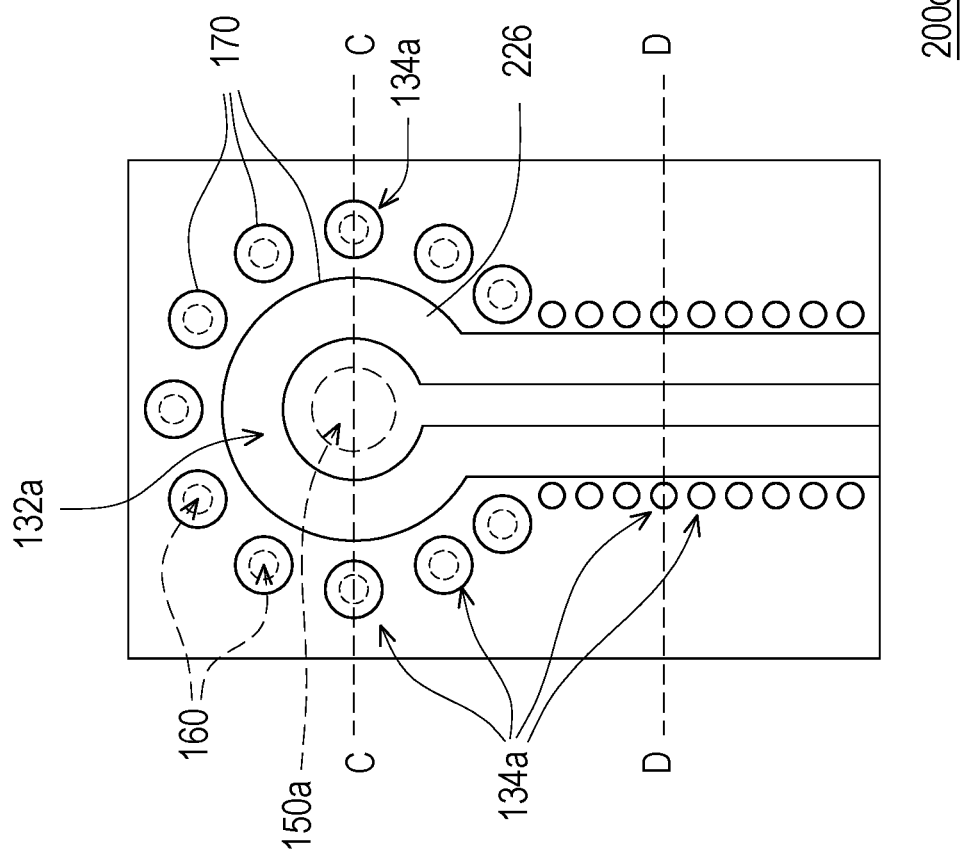
FIG. 27A is a schematic top view of a circuit board structure according to another embodiment of the invention.
Figure 27B:
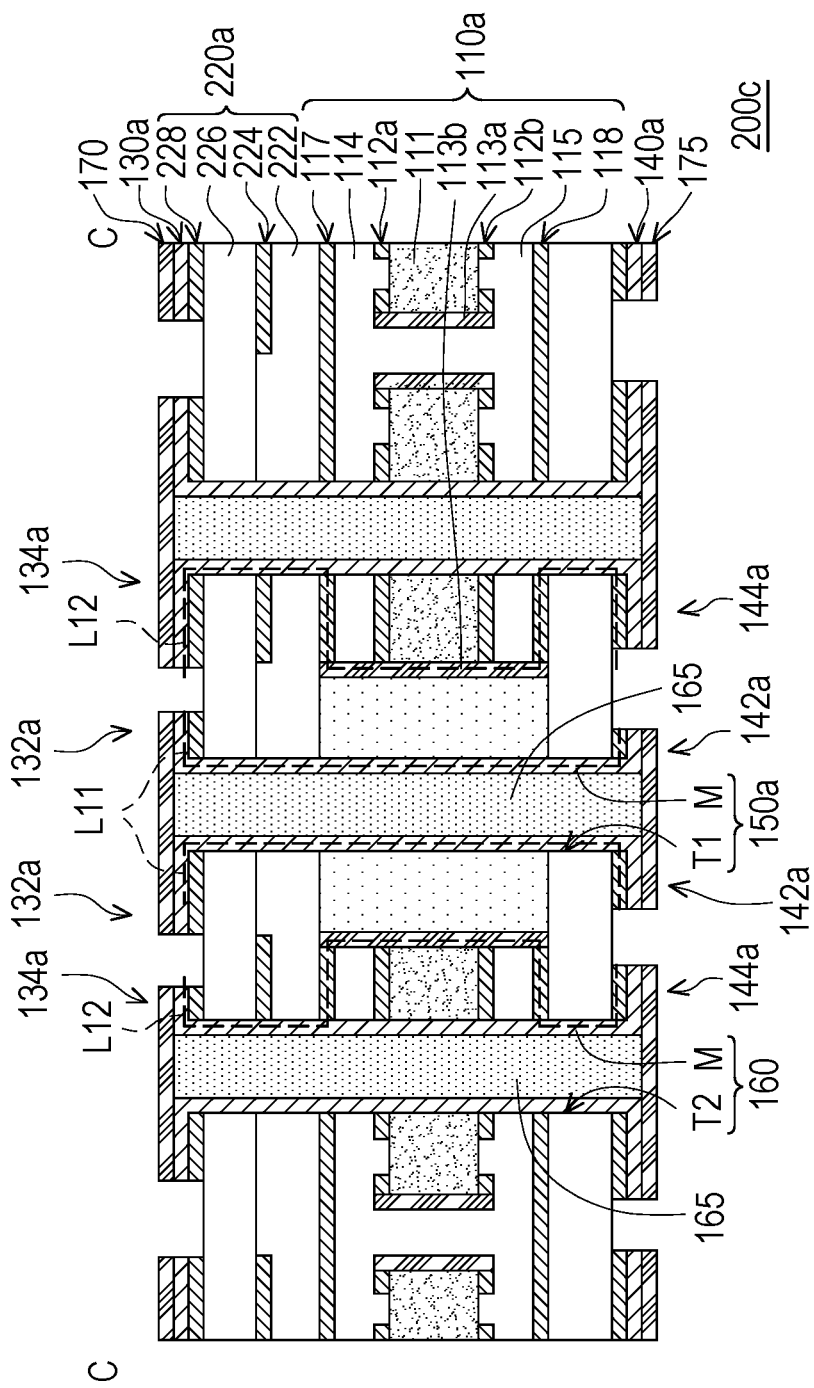
FIG. 27B is a schematic cross-sectional view along line C-C of FIG. 27A.
Figure 27C:
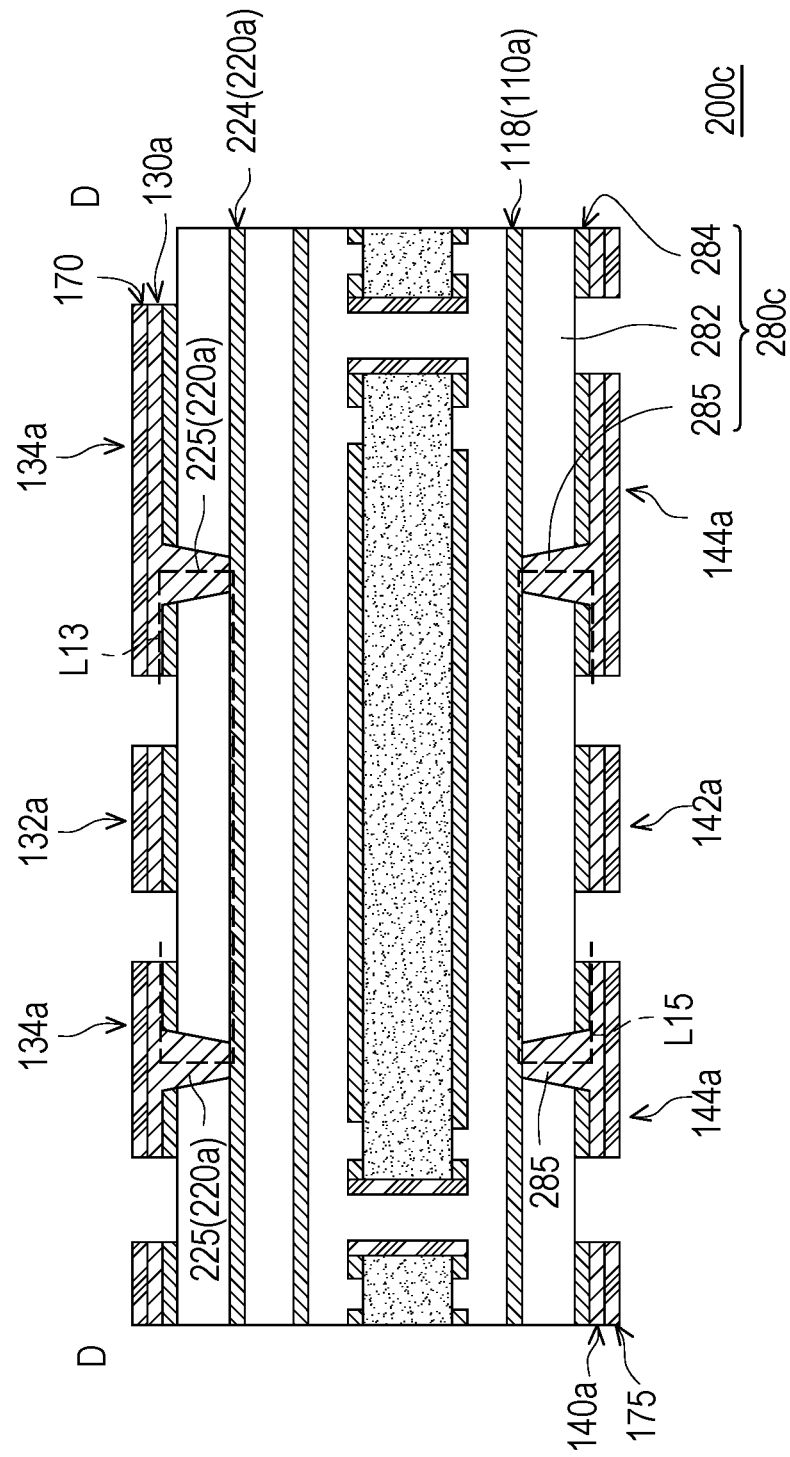
FIG. 27C is a schematic cross-sectional view along line D-D of FIG. 27A.

FIG. 27A is a schematic top view of a circuit board structure according to another embodiment of the invention. FIG. 27B is a schematic cross-sectional view along line C-C of FIG. 27A. FIG. 27C is a schematic cross-sectional view along line D-D of FIG. 27A. Please refer first to FIG. 11, FIG. 27A, and FIG. 27B at the same time. A circuit board structure 200c of the present embodiment is similar to the circuit board structure 100f, and the difference between the two is: in the present embodiment, the circuit board structure 200c further includes the hole filling material 165, the first cover layer 170, and the second cover layer 175. The hole filling material 165 completely fills the first conductive vias 150a and the second conductive vias 160, and the two opposite sides of the hole filling material 165 may be aligned with the first external circuit layer 130a and the second external circuit layer 140a, respectively. Here, the material of the hole filling material 165 is, for example, resin, which may be regarded as a hole plugging agent, or a dielectric material with a dielectric constant greater than 3.6 and a dielectric loss lower than 0.05. The first cover layer 170 covers the first external circuit layer 130a. The second cover layer 175 covers the second external circuit layer 140a, wherein the first cover layer 170 and the second cover layer 175 cover two opposite ends of the hole filling material 165 respectively. Here, the material of the first cover layer 170 and the material of the second cover layer 175 may be, for example, copper, but not limited thereto. Then, referring to FIG. 27C, the first ground circuit 134a, the first conductive blind hole 225, and the third circuit layer 224 define the ground path L13, and the ground path L13 surrounds the first signal circuit 132a and is enclosed in a closed manner, and therefore a good high-frequency high-speed loop may be formed. Moreover, a second build-up structure layer 280c further includes at least one second conductive blind hole 285, wherein the second conductive blind hole 285 penetrates a fifth circuit layer 284 and a sixth dielectric layer 282 and is electrically connected to the second external circuit layer 140a, the fifth circuit layer 284, and the second circuit layer 118. The second ground circuit 144a, the second conductive blind hole 285, and the second circuit layer 118 define a ground path L15, and the ground path L15 surrounds the second signal circuit 142a and is enclosed in a closed manner, and therefore a good high-frequency high-speed loop may be formed.

Figure 28A:
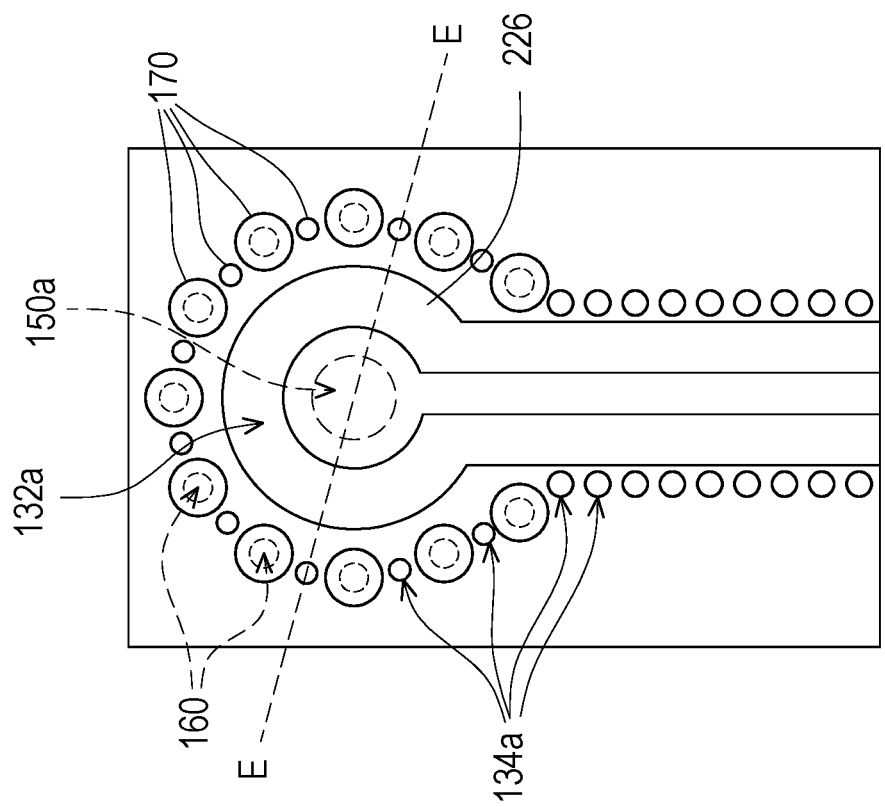
FIG. 28A is a schematic top view of a circuit board structure according to another embodiment of the invention.
Figure 28B:
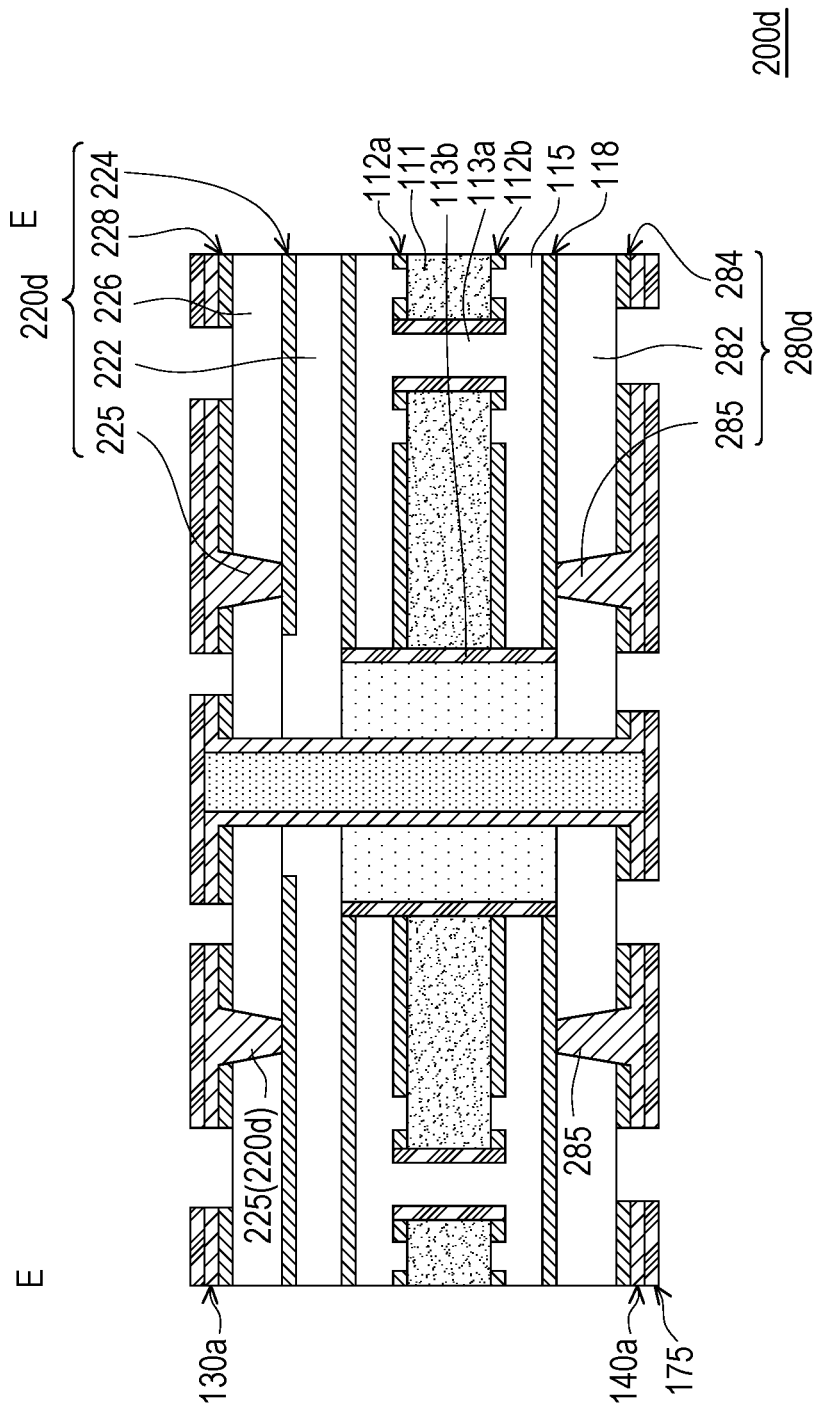
FIG. 28B is a schematic cross-sectional view along line E-E of FIG. 28A.

FIG. 28A is a schematic top view of a circuit board structure according to another embodiment of the invention. FIG. 28B is a schematic cross-sectional view along line E-E of FIG. 28A. In order to achieve the object of impedance matching, the layout of the ground circuit may be designed not only in the design of a through hole, but also in the design of a blind hole. Please refer to FIG. 27B, FIG. 28A, and FIG. 28B at the same time, a circuit board structure 200d of the present embodiment is similar to the circuit board structure 200c, and the difference between the two is: in the present embodiment, a first build-up structure layer 220d further includes the at least one first conductive blind hole 225, wherein the first conductive blind hole 225 penetrates the fourth circuit layer 228 and the fifth dielectric layer 226 and is electrically connected to the first external circuit layer 130a, the fourth circuit layer 228, and the third circuit layer 224. A second build-up structure layer 280d further includes the at least one second conductive blind hole 285, wherein the second conductive blind hole 285 penetrates the fifth circuit layer 284 and the sixth dielectric layer 282 and is electrically connected to the second external circuit layer 140a, the fifth circuit layer 284, and the second circuit layer 118.

Figure 29:
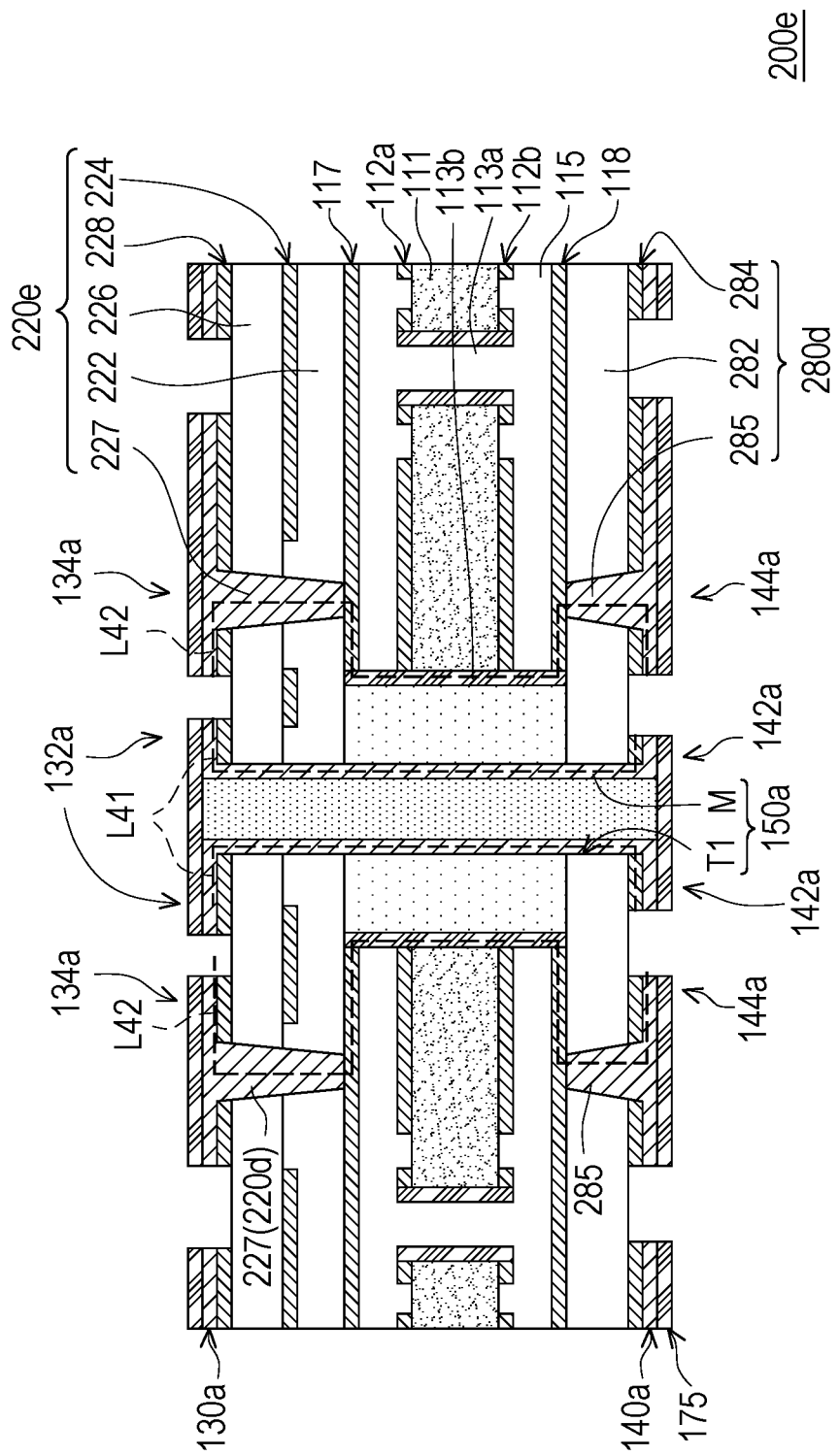
FIG. 29 is a schematic cross-sectional view of a circuit board structure according to another embodiment of the invention.

FIG. 29 is a schematic cross-sectional view of a circuit board structure according to another embodiment of the invention. Please refer to FIG. 28B and FIG. 29 at the same time, a circuit board structure 200e of the present embodiment is similar to the circuit board structure 200d, and the difference between the two is: in the present embodiment, a first conductive blind hole 227 of a first build-up structure layer 220e penetrates the fourth circuit layer 228, the fifth dielectric layer 226, and the fourth dielectric layer 222 and is electrically connected to the first external circuit layer 130a, the fourth circuit layer 228, and the first circuit layer 117. The first signal circuit 132a, the first conductive vias 150a, and the second signal circuit 142a define a signal path L41. The first ground circuit 134a, the first conductive blind hole 227, the first circuit layer 117, the outer conductive layer 113b, the second circuit layer 118, the second conductive blind hole 285, and the second ground circuit 144a define a ground path L42. Since the signal path L41 is surrounded by the ground path L42 and enclosed in a closed manner, a good high-frequency high-speed loop may be formed.

Figure 30:
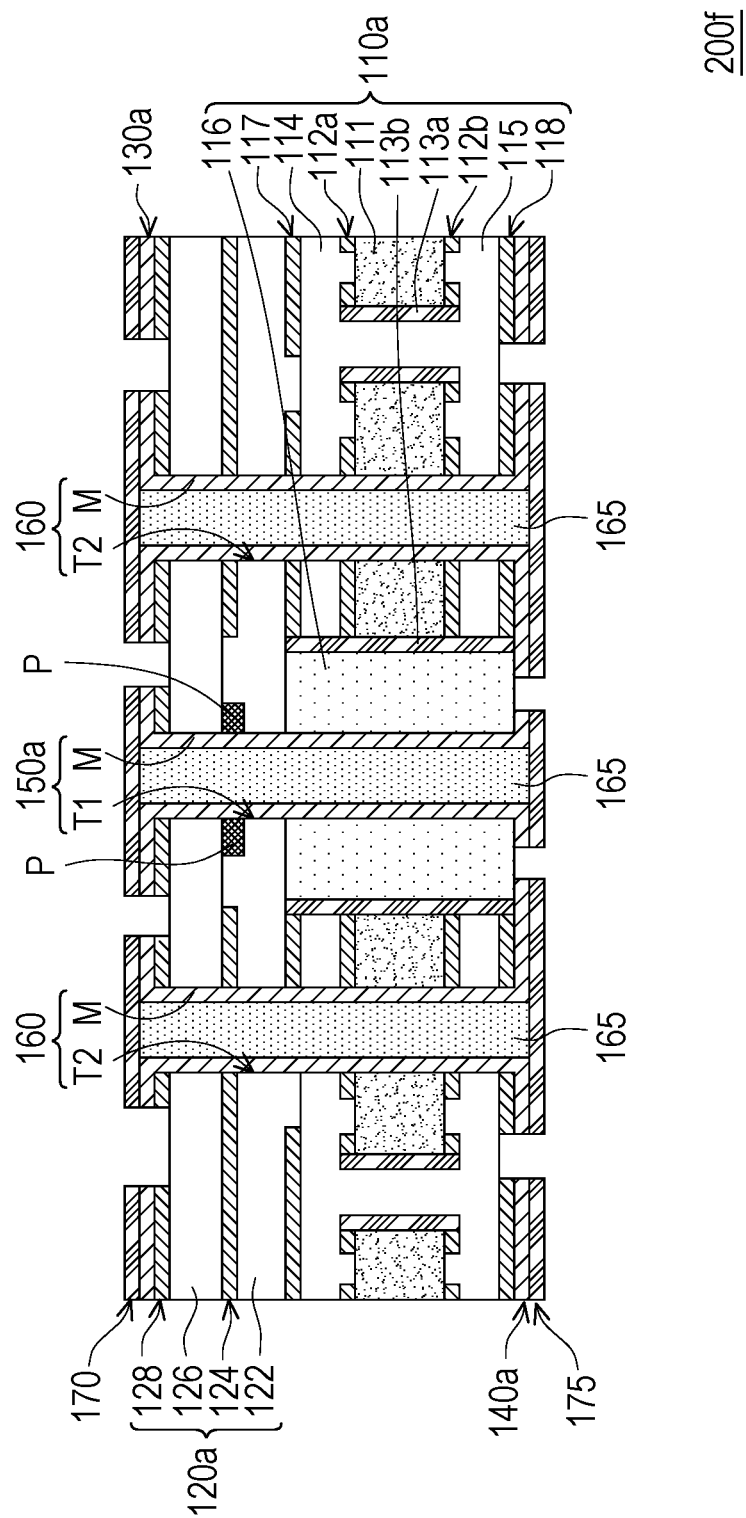
FIG. 30 is a schematic cross-sectional view of a circuit board structure according to another embodiment of the invention.

FIG. 30 is a schematic cross-sectional view of a circuit board structure according to another embodiment of the invention. Please refer to FIG. 6A and FIG. 30 at the same time. A circuit board structure 200f of the present embodiment is similar to the circuit board structure 100f, and the difference between the two is: in the present embodiment, the circuit board structure 200f further includes at least one pad P disposed in the fourth dielectric layer 122 and connected to the first conductive vias 150a to achieve impedance matching. Here, the pad P may be regarded as an internal signal circuit pattern.

Figure 31:
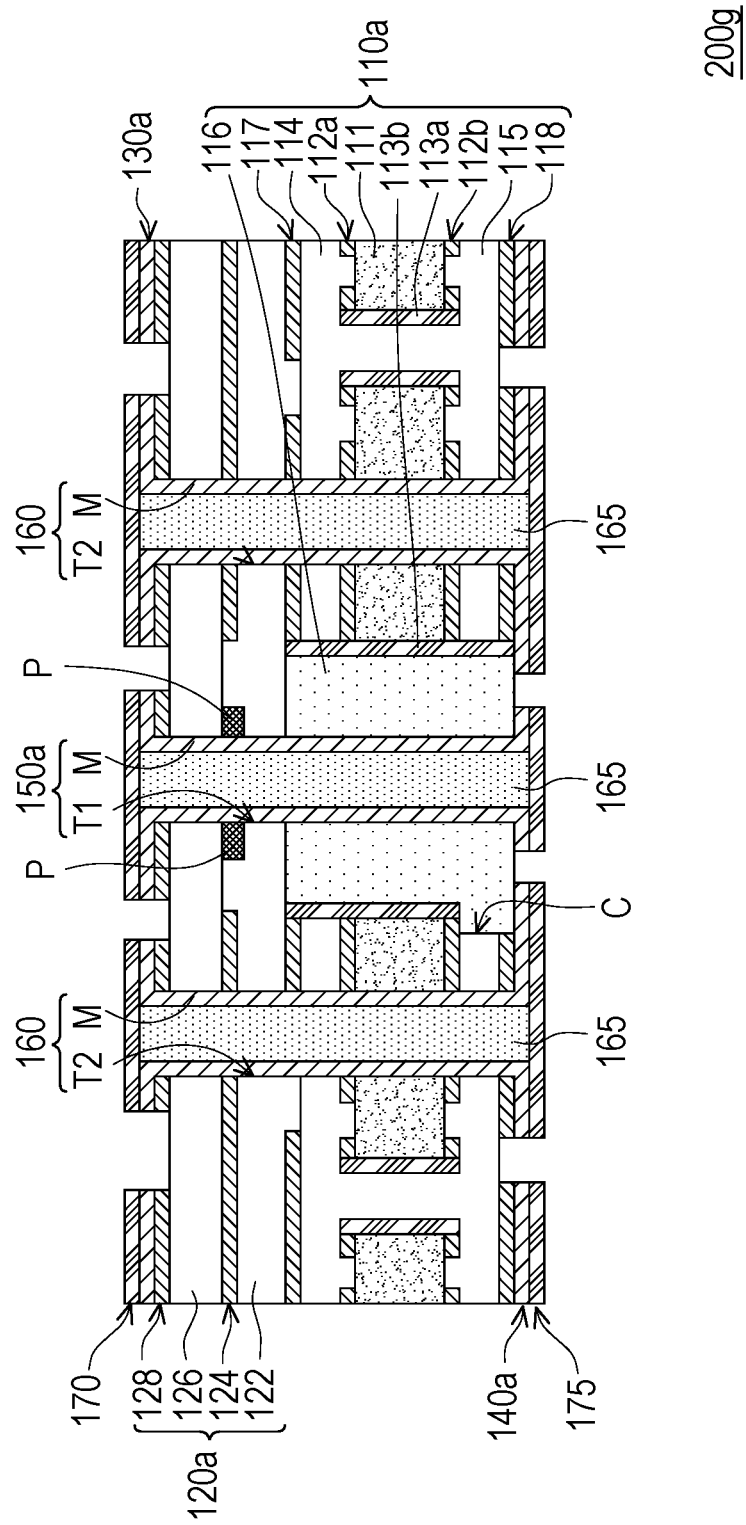
FIG. 31 is a schematic cross-sectional view of a circuit board structure according to another embodiment of the invention.

FIG. 31 is a schematic cross-sectional view of a circuit board structure according to another embodiment of the invention. Please refer to FIG. 8A and FIG. 31 at the same time. A circuit board structure 200g of the present embodiment is similar to the circuit board structure 100h, and the difference between the two is: in the present embodiment, the circuit board structure 200g further includes the hole filling material 165, the first cover layer 170, and the second cover layer 175. The hole filling material 165 completely fills the first conductive vias 150a and the second conductive vias 160, and the two opposite sides of the hole filling material 165 may be aligned with the first external circuit layer 130a and the second external circuit layer 140a, respectively. Here, the material of the hole filling material 165 is, for example, resin, which may be regarded as a hole plugging agent, or a dielectric material with a dielectric constant greater than 3.6 and a dielectric loss lower than 0.05. The first cover layer 170 covers the first external circuit layer 130a. The second cover layer 175 covers the second external circuit layer 140a, wherein the first cover layer 170 and the second cover layer 175 cover two opposite ends of the hole filling material 165 respectively. Here, the material of the first cover layer 170 and the material of the second cover layer 175 may be, for example, copper, but not limited thereto. In addition, the circuit board structure 200g of the present embodiment further includes the at least one pad P disposed in the fourth dielectric layer 122 and connected to the first conductive vias 150a, so as to achieve impedance matching. Here, the pad P may be regarded as an internal signal circuit pattern.

Figure 32:
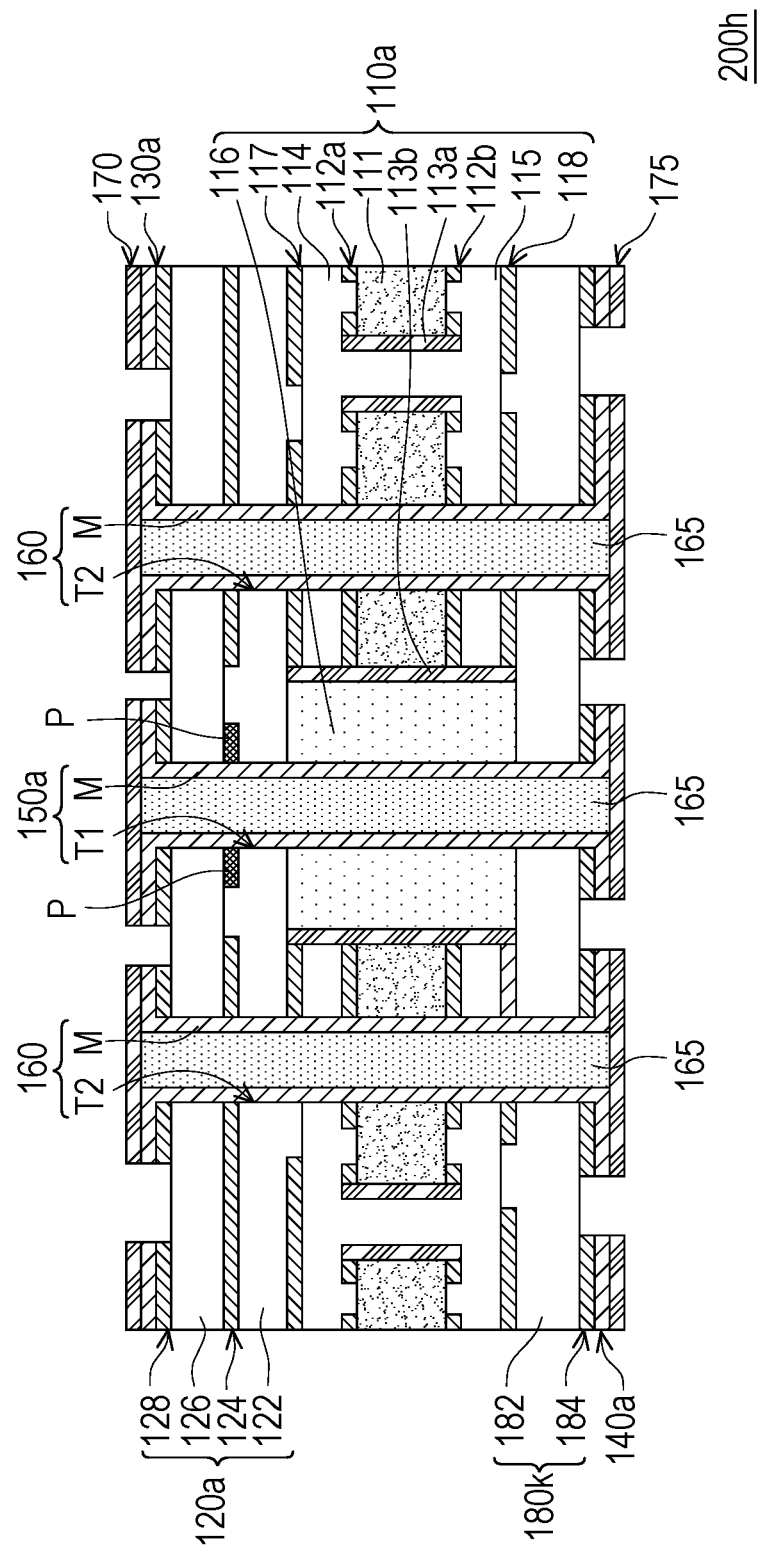
FIG. 32 is a schematic cross-sectional view of a circuit board structure according to another embodiment of the invention.

FIG. 32 is a schematic cross-sectional view of a circuit board structure according to another embodiment of the invention. Please refer to FIG. 11 and FIG. 32 at the same time. A circuit board structure 200h of the present embodiment is similar to the circuit board structure 100k, and the difference between the two is: in the present embodiment, the circuit board structure 200h further includes the hole filling material 165, the first cover layer 170, and the second cover layer 175. The hole filling material 165 completely fills the first conductive vias 150a and the second conductive vias 160, and the two opposite sides of the hole filling material 165 may be aligned with the first external circuit layer 130a and the second external circuit layer 140a, respectively. Here, the material of the hole filling material 165 is, for example, resin, which may be regarded as a hole plugging agent, or a dielectric material with a dielectric constant greater than 3.6 and a dielectric loss lower than 0.05. The first cover layer 170 covers the first external circuit layer 130a. The second cover layer 175 covers the second external circuit layer 140a, wherein the first cover layer 170 and the second cover layer 175 cover two opposite ends of the hole filling material 165 respectively. Here, the material of the first cover layer 170 and the material of the second cover layer 175 may be, for example, copper, but not limited thereto. In addition, the circuit board structure 200h of the present embodiment further includes the at least one pad P disposed in the fourth dielectric layer 122 and connected to the first conductive vias 150a, so as to achieve impedance matching. Here, the pad P may be regarded as an internal signal circuit pattern.

Figure 33:
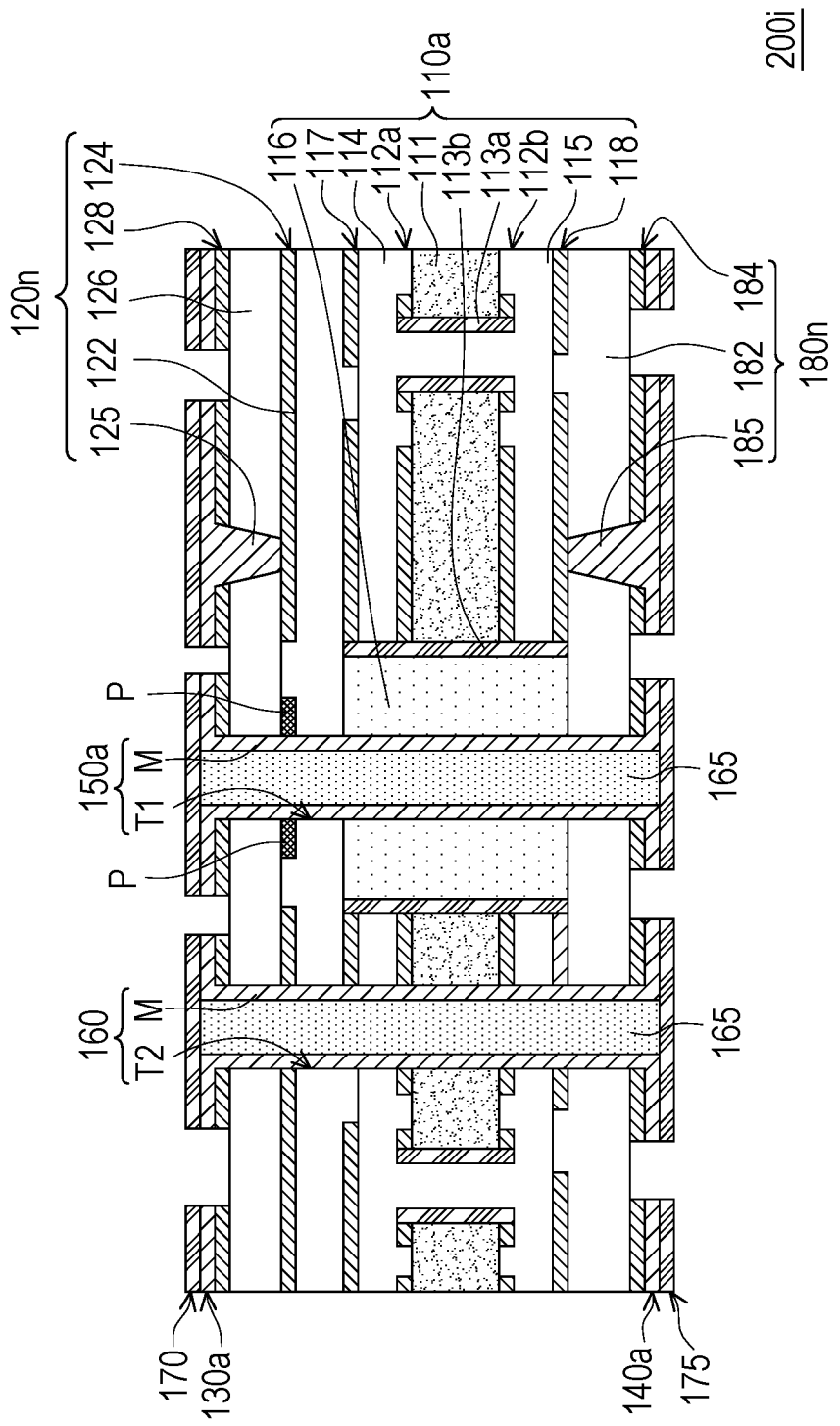
FIG. 33 is a schematic cross-sectional view of a circuit board structure according to another embodiment of the invention.

FIG. 33 is a schematic cross-sectional view of a circuit board structure according to another embodiment of the invention. Please refer to FIG. 13 and FIG. 33 at the same time. A circuit board structure 200i of the present embodiment is similar to the circuit board structure 100n, and the difference between the two is: in the present embodiment, the circuit board structure 200i further includes the hole filling material 165, the first cover layer 170, and the second cover layer 175. The hole filling material 165 completely fills the first conductive vias 150a and the second conductive vias 160, and the two opposite sides of the hole filling material 165 may be aligned with the first external circuit layer 130a and the second external circuit layer 140a, respectively. Here, the material of the hole filling material 165 is, for example, resin, which may be regarded as a hole plugging agent, or a dielectric material with a dielectric constant greater than 3.6 and a dielectric loss lower than 0.05. The first cover layer 170 covers the first external circuit layer 130a. The second cover layer 175 covers the second external circuit layer 140a, wherein the first cover layer 170 and the second cover layer 175 cover two opposite ends of the hole filling material 165 respectively. Here, the material of the first cover layer 170 and the material of the second cover layer 175 may be, for example, copper, but not limited thereto. In addition, the circuit board structure 200i of the present embodiment further includes the at least one pad P disposed in the fourth dielectric layer 122 and connected to the first conductive vias 150a, so as to achieve impedance matching. Here, the pad P may be regarded as an internal signal circuit pattern.

Figure 34:
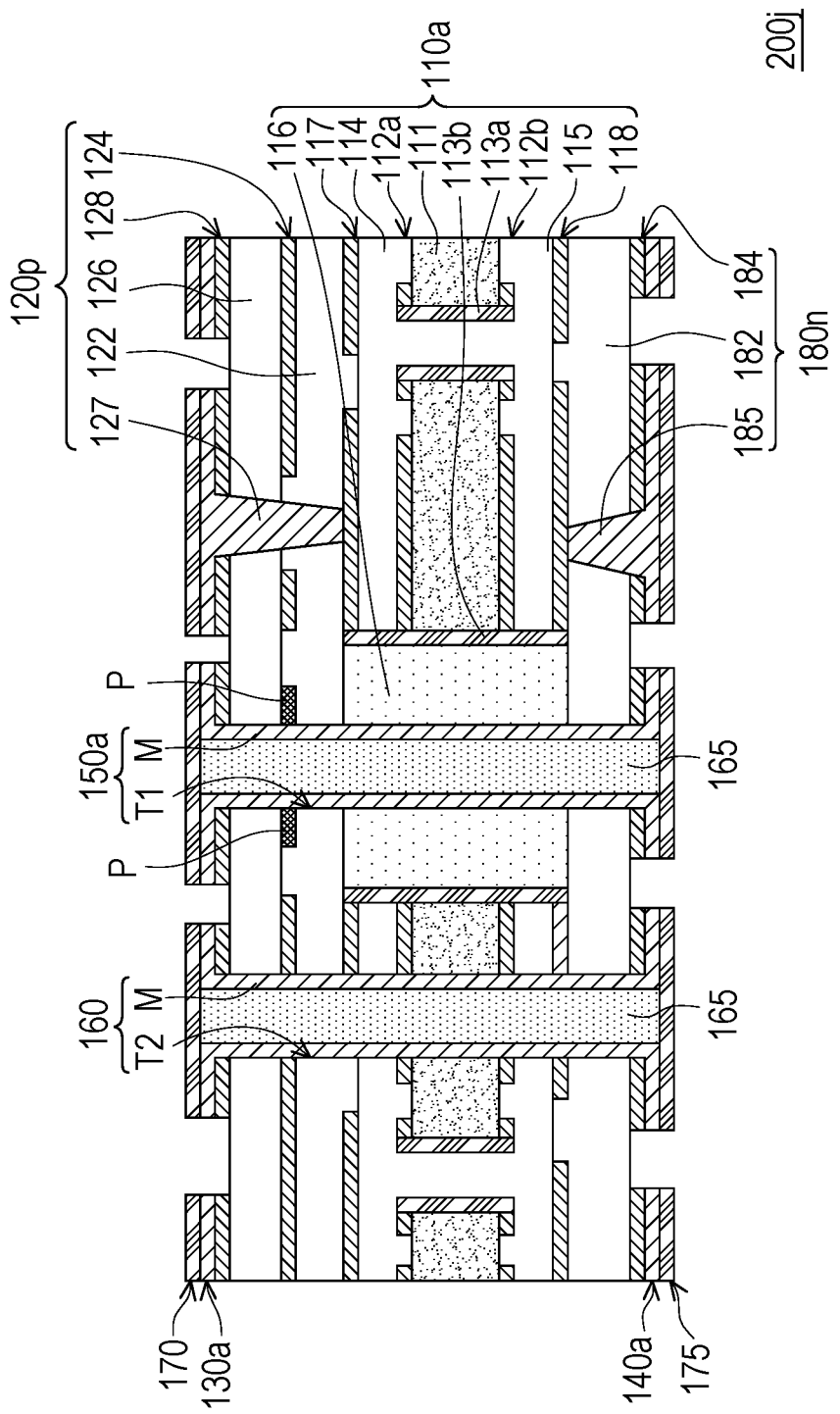
FIG. 34 is a schematic cross-sectional view of a circuit board structure according to another embodiment of the invention.

FIG. 34 is a schematic cross-sectional view of a circuit board structure according to another embodiment of the invention. Please refer to FIG. 14 and FIG. 34 at the same time. A circuit board structure 200j of the present embodiment is similar to the circuit board structure 100*p*, and the difference between the two is: in the present embodiment, the circuit board structure 200*j* further includes the hole filling material 165, the first cover layer 170, and the second cover layer 175. The hole filling material 165 completely fills the first conductive vias 150*a* and the second conductive vias 160, and the two opposite sides of the hole filling material 165 may be aligned with the first external circuit layer 130*a* and the second external circuit layer 140*a*, respectively. Here, the material of the hole filling material 165 is, for example, resin, which may be regarded as a hole plugging agent, or a dielectric material with a dielectric constant greater than 3.6 and a dielectric loss lower than 0.05. The first cover layer 170 covers the first external circuit layer 130*a*. The second cover layer 175 covers the second external circuit layer 140*a*, wherein the first cover layer 170 and the second cover layer 175 cover two opposite ends of the hole filling material 165 respectively. Here, the material of the first cover layer 170 and the material of the second cover layer 175 may be, for example, copper, but not limited thereto. In addition, the circuit board structure 200*j* of the present embodiment further includes the at least one pad P disposed in the fourth dielectric layer 122 and connected to the first conductive vias 150*a*, so as to achieve impedance matching. Here, the pad P may be regarded as an internal signal circuit pattern.

Figure 35:
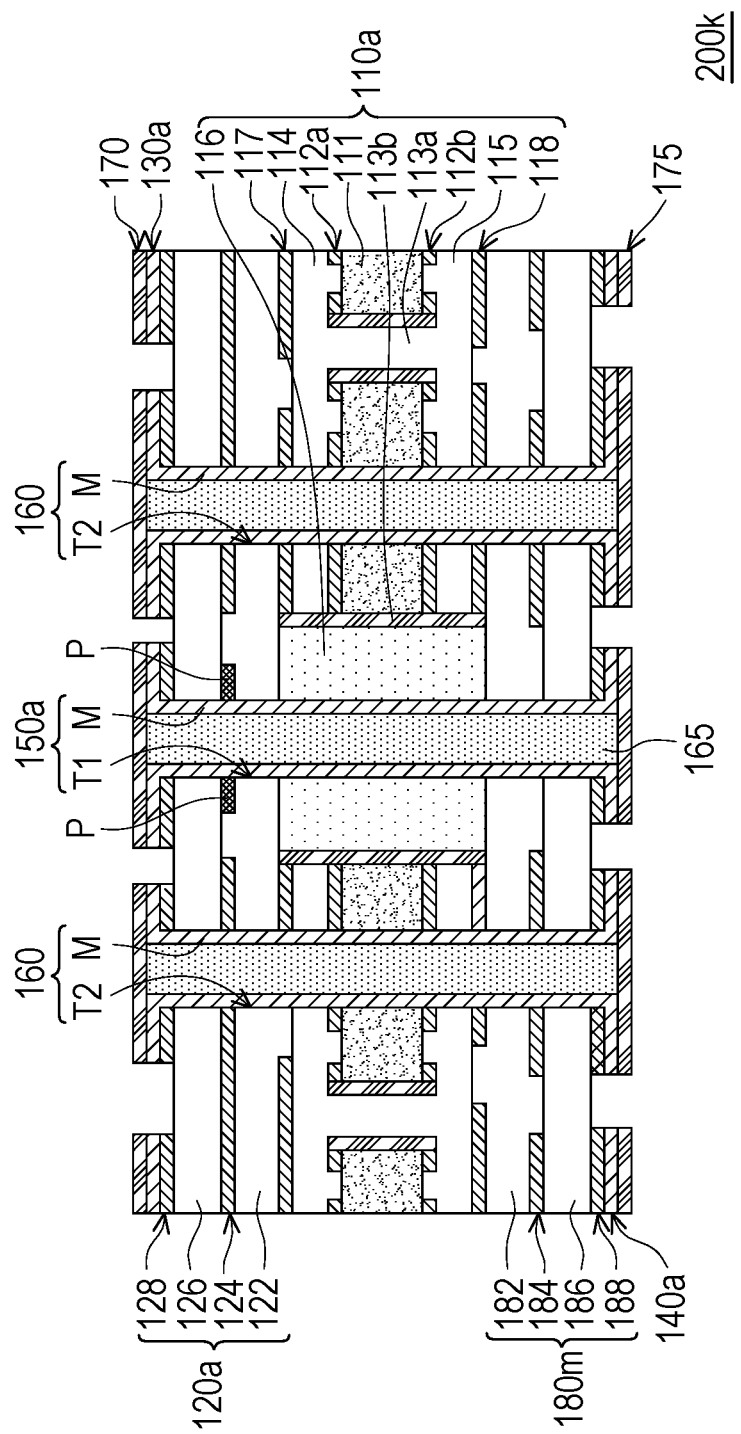
FIG. 35 is a schematic cross-sectional view of a circuit board structure according to another embodiment of the invention.

FIG. 35 is a schematic cross-sectional view of a circuit board structure according to another embodiment of the invention. Please refer to FIG. 12 and FIG. 35 at the same time. A circuit board structure 200*k* of the present embodiment is similar to the circuit board structure 100*m*, and the difference between the two is: in the present embodiment, the circuit board structure 200*k* further includes the hole filling material 165, the first cover layer 170, and the second cover layer 175. The hole filling material 165 completely fills the first conductive vias 150*a* and the second conductive vias 160, and the two opposite sides of the hole filling material 165 may be aligned with the first external circuit layer 130*a* and the second external circuit layer 140*a*, respectively. Here, the material of the hole filling material 165 is, for example, resin, which may be regarded as a hole plugging agent, or a dielectric material with a dielectric constant greater than 3.6 and a dielectric loss lower than 0.05. The first cover layer 170 covers the first external circuit layer 130*a*. The second cover layer 175 covers the second external circuit layer 140*a*, wherein the first cover layer 170 and the second cover layer 175 cover two opposite ends of the hole filling material 165 respectively. Here, the material of the first cover layer 170 and the material of the second cover layer 175 may be, for example, copper, but not limited thereto. In addition, the circuit board structure 200*k* of the present embodiment further includes the at least one pad P disposed in the fourth dielectric layer 122 and connected to the first conductive vias 150*a*, so as to achieve impedance matching. Here, the pad P may be regarded as an internal signal circuit pattern.

It should be noted that, the object of impedance matching may be achieved by designing the surface signal circuit pattern (as shown in FIG. 1A, FIG. 15A, and FIG. 20), the internal signal circuit pattern (see the pads P in FIG. 30 to FIG. 35), the displacement amount of the coaxial vias (as shown in the dislocation configuration of FIG. 2A), or the layout of ground through holes and/or blind holes (as shown in FIG. 1A, FIG. 13, or FIG. 14).

Figure 36:
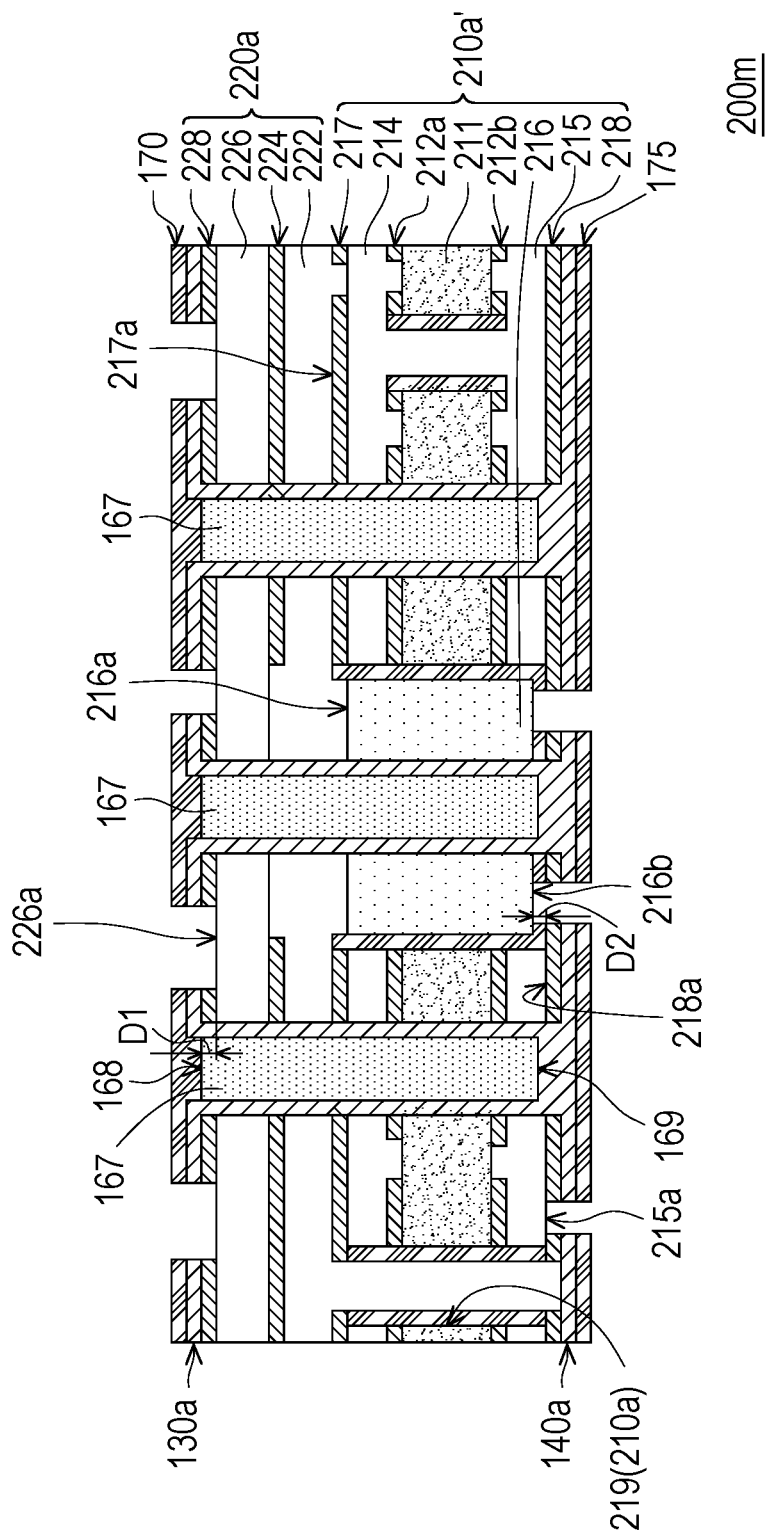
FIG. 36 is a schematic cross-sectional view of a circuit board structure according to another embodiment of the invention.

FIG. 36 is a schematic cross-sectional view of a circuit board structure according to another embodiment of the invention. Please refer to FIG. 25B and FIG. 36 at the same time, a circuit board structure 200*m* of the present embodiment is similar to the circuit board structure 200*a*, and the difference between the two is: in the present embodiment, there is a height difference D1 between a first side 168 and a second side 169 opposite to each other of the hole filling material 167 and a first surface 226*a* of the fifth dielectric layer 226 and a second surface 215*a* of the second dielectric layer 215, respectively, and the height difference D1 ranges from, for example, more than negative 30 microns to less than positive 30 microns. Here, the first side 168 of the hole filling material 167 is higher than the first surface 226*a* of the fifth dielectric layer 226, that is, the first side 168 of the hole filling material 167 is protruded from the first surface 226*a* of the fifth dielectric layer 226, and the height difference D1 is positive 30 microns; the second side 169 of the hole filling material 167 is higher than the second surface 215*a* of the second dielectric layer 215, that is, the second side 169 of the hole filling material 167 is recessed in the second surface 215*a* of the second dielectric layer 215, and the height difference is negative 30 microns. In addition, two surfaces 216*a* and 216*b* opposite to each other of a third dielectric layer 216 of a substrate 210*a'* of the present embodiment are also lower than a surface 217*a* of the first circuit layer 217 and higher than a surface 218*a* of the second circuit layer 218, respectively. That is, the third dielectric layer 216 is recessed between the first circuit layer 217 and the second circuit layer 218, wherein there is a height difference D2 between the surface 216*b* of the third dielectric layer 216 and the surface 218*a* of the second circuit layer 218, and the height difference D2 ranges from, for example, more than negative 30 microns to equal to 0 microns. Here, since the third dielectric layer 216 is recessed in the second circuit layer 218, the height difference D2 is negative 30 microns. If the third dielectric layer 216 is aligned with the second circuit layer 218, the height difference is 0 microns. Therefore, the circuit board structure 200*m* of the present embodiment may have better electrical performance.

Based on the above, in the design of the circuit board structure of the invention, the first conductive via is electrically connected to the first external circuit layer and the second external circuit layer to define a signal path, and the first external circuit layer, the second conductive vias, the first circuit layer, the outer conductive layer, and the second external circuit layer define a ground path, and the ground path surrounds the signal path. Accordingly, a good high-frequency high-speed signal loop may be formed, and in the subsequent application of integrated circuits and antennas, the issue of signal interference on the same plane may also be solved, thus reducing signal energy loss and noise interference, thereby improving signal transmission reliability.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A circuit board structure, comprising:
   a substrate having at least one first opening and comprising a core layer, a first inner circuit layer, a second inner circuit layer, an inner conductive layer, a first dielectric layer, a second dielectric layer, a third dielectric layer, a first circuit layer, a second circuit layer, and an outer conductive layer, the first inner circuit layer and the second inner circuit layer are disposed on two opposite sides of the core layer, the core layer has a plurality of second openings, the inner conductive layer covers an inner wall of the second openings and is connected to the first inner circuit layer and the second inner circuit layer, the first dielectric layer covers the first inner circuit layer and is located between the first inner circuit layer and the first circuit layer, the second dielectric layer covers the second inner circuit layer and is located between the second inner circuit layer and the second circuit layer, the at least one first opening is located between the second openings and penetrates the first circuit layer, the first dielectric layer, the first inner circuit layer, the core layer, the second inner circuit layer, and the second dielectric layer, and the outer conductive layer covers an inner wall of the at least one first opening and is connected to the first circuit layer, the first inner circuit layer, the second inner circuit layer, and the second circuit layer, and the third dielectric layer completely fills the at least one first opening;
a first build-up structure layer disposed on the first circuit layer;
a first external circuit layer disposed on the first build-up structure layer;
a second external circuit layer disposed on the second circuit layer and a portion of the third dielectric layer;
at least one first conductive via penetrating the first build-up structure layer and the third dielectric layer and electrically connected to the first external circuit layer and the second external circuit layer to define a signal path; and
a plurality of second conductive vias surrounding the at least one first conductive via and penetrating the first build-up structure layer, the first circuit layer, the first dielectric layer, the first inner circuit layer, the core layer, the second inner circuit layer, the second dielectric layer, and the second circuit layer and electrically connected to the first external circuit layer, the first circuit layer, the first inner circuit layer, the second inner circuit layer, and the second circuit layer, the first external circuit layer, the second conductive vias, the first circuit layer, the outer conductive layer, and the second external circuit layer define a first ground path, and the first ground path surrounds the signal path.

2. The circuit board structure of claim 1, wherein the first build-up structure layer comprises a fourth dielectric layer, a third circuit layer, a fifth dielectric layer, and a fourth circuit layer, the fourth dielectric layer is disposed on the first circuit layer and the third dielectric layer, the third circuit layer is disposed on the fourth dielectric layer, and the fifth dielectric layer is disposed on the third circuit layer and the fourth dielectric layer, and the fourth circuit layer is disposed on the fifth dielectric layer, and the first external circuit layer is disposed on the fourth circuit layer.

3. The circuit board structure of claim 2, further comprising:
a second build-up structure layer disposed on the second circuit layer and a portion of the third dielectric layer, and the second external circuit layer is located on the second build-up structure layer.

4. The circuit board structure of claim 3, wherein the first build-up structure layer further comprises at least one first conductive blind hole penetrating the fifth dielectric layer and the fourth dielectric layer and electrically connected to the first external circuit layer, the fourth circuit layer, and the third circuit layer, and the second build-up structure layer further comprises at least one second conductive blind hole penetrating the second build-up structure layer and electrically connected to the second external circuit layer and the second circuit layer.

5. The circuit board structure of claim 3, wherein the first build-up structure layer further comprises at least one first conductive blind hole penetrating the fifth dielectric layer and the fourth dielectric layer and electrically connected to the first external circuit layer and the first circuit layer, and the second build-up structure layer further comprises at least one second conductive blind hole penetrating the second build-up structure layer and electrically connected to the second external circuit layer and the second circuit layer.

6. The circuit board structure of claim 2, wherein the substrate further has at least one third opening penetrating the first circuit layer, the first dielectric layer, the first inner circuit layer, the core layer, the second inner circuit layer, the second dielectric layer, and the second circuit layer, and communicating with the fourth dielectric layer and the second external circuit layer.

7. The circuit board structure of claim 6, wherein the first build-up structure layer further comprises at least one first conductive blind hole penetrating the fifth dielectric layer and the fourth circuit layer and electrically connected to the first external circuit layer, the fourth circuit layer, and the third circuit layer.

8. The circuit board structure of claim 2, further comprising:
at least one pad disposed in the fourth dielectric layer of the first build-up structure layer and connected to the at least one first conductive via.

9. The circuit board structure of claim 1, wherein a gap is formed between the outer conductive layer, the second dielectric layer, and the second circuit layer, and the third dielectric layer further completely fills the gap.

10. The circuit board structure of claim 1, further comprising:
a hole filling material at least completely filling the second conductive vias.

11. The circuit board structure of claim 10, wherein the hole filling material further completely fills the at least one first conductive via.

12. The circuit board structure of claim 11, further comprising:
a first cover layer covering the first external circuit layer; and
a second cover layer covering the second external circuit layer, wherein the first cover layer and the second cover layer cover two ends of the hole filling material respectively.

13. The circuit board structure of claim 11, further comprising:
a first cover layer covering the first external circuit layer; and
a second cover layer covering the second external circuit layer, wherein the first cover layer and the second cover layer respectively cover two ends of the hole filling material completely filling the at least one first conductive via, and expose the two ends of the hole filling material located in the second conductive vias.

14. The circuit board structure of claim 1, wherein the at least one first conductive via comprises two first conductive vias.

15. The circuit board structure of claim 14, further comprising:
a hole filling material at least completely filling the second conductive vias.

16. The circuit board structure of claim 15, further comprising:
- a first cover layer covering the first external circuit layer; and
- a second cover layer covering the second external circuit layer, wherein the first cover layer and the second cover layer at least respectively cover two ends of the hole filling material completely filling the first conductive vias.

17. The circuit board structure of claim 14, further comprising:
- a third conductive via penetrating the first build-up structure layer, the first circuit layer, the first dielectric layer, the first inner circuit layer, the core layer, the second inner circuit layer, the second dielectric layer, and the second circuit layer, and electrically connected to the first external circuit layer, the first circuit layer, the first inner circuit layer, the second inner circuit layer, and the second circuit layer, the third conductive via is located between the first conductive vias, and the first external circuit layer, the third conductive via, the first circuit layer, the outer conductive layer, and the second external circuit layer define a second ground path, and the signal path is located between the first ground path and the second ground path.

18. The circuit board structure of claim 17, further comprising:
- a hole filling material at least completely filling the second conductive vias and the third conductive via.

19. The circuit board structure of claim 18, further comprising:
- a first cover layer covering the first external circuit layer; and
- a second cover layer covering the second external circuit layer, wherein the first cover layer and the second cover layer at least respectively cover two ends of the hole filling material completely filling the first conductive vias.

20. The circuit board structure of claim 1, wherein the first external circuit layer comprises a first signal circuit and a first ground circuit, and the second external circuit layer comprises a second signal circuit and a second ground circuit, the first signal circuit, the at least one first conductive via, and the second signal circuit define the signal path, and the first ground circuit, each of the second conductive vias, the first circuit layer, the outer conductive layer, and the second ground circuit define the first ground path.

21. The circuit board structure of claim 1, further comprising:
- a hole filling material at least completely filling the second conductive vias, wherein the first build-up structure layer comprises a fourth dielectric layer, a third circuit layer, a fifth dielectric layer, and a fourth circuit layer, the fourth dielectric layer is disposed on the first circuit layer and the third dielectric layer, the third circuit layer is disposed on the fourth dielectric layer, and the fifth dielectric layer is disposed on the third circuit layer and the fourth dielectric layer, and the fourth circuit layer is disposed on the fifth dielectric layer, and the first external circuit layer is disposed on the fourth circuit layer, there is a height difference between a first side and a second side of the hole filling material opposite to each other and a first surface of the fifth dielectric layer and a second surface of the second dielectric layer, respectively, and the height difference ranges from more than negative 30 microns to less than positive 30 microns.

22. The circuit board structure of claim 1, wherein the third dielectric layer is recessed between a surface of the first circuit layer and a surface of the second circuit layer, and there is a height difference between a surface of the third dielectric layer and the surface of the second circuit layer, and the height difference ranges from more than negative 30 microns to equal to 0 microns.

* * * * *